United States Patent [19]

Ootani

[11] Patent Number: 5,479,371
[45] Date of Patent: Dec. 26, 1995

[54] SEMICONDUCTOR MEMORY DEVICE

[75] Inventor: Takayuki Ootani, Hachioji, Japan

[73] Assignee: Kabushiki Kaisha Toshiba, Kawasaki, Japan

[21] Appl. No.: 170,890

[22] Filed: Dec. 21, 1993

[30] Foreign Application Priority Data

Dec. 21, 1992 [JP] Japan .................................. 4-340354

[51] Int. Cl.⁶ ..................................................... G11C 7/00
[52] U.S. Cl. ......................... 365/200; 365/225.7; 327/526
[58] Field of Search ................................ 365/200, 225.7; 327/526

[56] References Cited

U.S. PATENT DOCUMENTS

| | | | |
|---|---|---|---|
| 4,571,706 | 2/1986 | Iwahashi et al. | 365/200 |
| 4,587,638 | 5/1986 | Isobe et al. | 365/200 |
| 4,604,730 | 8/1986 | Yoshida et al. | 365/200 |
| 4,791,319 | 12/1988 | Tagami et al. | 365/200 |
| 5,134,585 | 7/1992 | Murakami et al. | 365/200 |
| 5,282,165 | 1/1994 | Miyake et al. | 365/200 |

*Primary Examiner*—David C. Nelms
*Assistant Examiner*—Son Dinh
*Attorney, Agent, or Firm*—Foley & Lardner

[57] ABSTRACT

There is disclosed a semiconductor memory device comprising a plurality of blocks in which memory cells are respectively arranged on a plurality of normal rows and one spare row. Each block includes a plurality of normal row selection lines for selecting any one of the normal rows, and one spare row selection line for instead selecting the spare row in the case where any one of the normal rows is defective. The device further comprises non-selection circuit elements provided for every normal row selection line, and being such that when a corresponding normal row is defective, the non-selection circuit element allows that defective normal row selection line to be brought into non-selective state; and a selector adapted so that when the normal rows in a corresponding block are all in non-selective state, the selector allows the spare row selection line to be brought into selective state. Also, with respect to a column direction, a circuit configuration similar to the above may be provided.

8 Claims, 20 Drawing Sheets

SEMICONDUCTOR MEMORY DEVICE

BACKGROUND OF THE INVENTION

This invention relates to a semiconductor memory device, and more particularly to a semiconductor memory device including a redundancy circuit.

Recently, in semiconductor memory devices, there is frequently employed a redundancy configuration for the purpose of preventing lowering of the yield followed by implementation of devices of large capacity. Namely, with a view to relaxation of lowering of the yield resulting from bit defects, columns defects, or row defects in a chip which occurs during manufacturing process, a spare memory cell array is mounted in advance on the chip to replace unsatisfactory (defective) portions found by inspection by corresponding spare cells to relieve an unsatisfactory chip. As a device including a redundancy circuit as mentioned above, there is a device described in, e.g., 1982 IEEE International Solid-State Circuit Conference Digest of Technical Paper, "A 64 Kb CMOS SRAMs", S.: Konishi, et al., pp. 258–259.

In order to replace a defective bit by a corresponding spare cell of a spare cell array by utilizing the redundancy configuration, in the case where an address signal for selecting a defective cell is inputted from the! exterior, it is necessary to realize a mechanism for providing an access to the spare cell array.

In general, there is employed a method in which fuse elements are formed by using wiring layer, etc. to carry out laser blow to blow off such element by irradiating laser beams thereto, thus to realize such an access mechanism. For example, in a SRAM adapted so that defective cells are relieved, e.g., with the row being as a unit, fuses are arranged between respective word lines and circuits for driving those word lines. In this case, a method is employed such that a fuse provided at a word line of a defective row is blown off in advance by laser beams so that this word line is not activated even if an address signal for selecting it is inputted. For such SRAM, there is a SRAM disclosed in, e.g., the Japanese Patent Application Laid Open No. 18899/1985 (Tokkaisho 60-18899), or the Japanese Patent Application Laid Open No. 20397/1985 (Takkaisho 60-20397).

As a SRAM related to this invention, the configuration of a SRAM where 8 spare rows are arranged in respect to 1024 normal rows is shown in FIG. 12. In this device, word lines are doubly arranged for the purpose of driving normal memory cells MC in a manner divided every sections.

At the end portion of a memory cell array NMA1501, a row main decoder RMD1501 is arranged. At the row main decoder RMD1501, a plurality of series circuits each comprising a NAND circuit NA1501, a word line buffer WB1501 comprised of two stages of inverters, and a defective row isolation fuse FU1501 are provided every normal main word line NWM. To the row main decoder RMD1501, row predecode signals generated by an address decoder AD1601 shown in FIG. 13 are delivered.

As shown in FIG. 13, an address signal of, e.g., 10 bits is inputted from the external to input terminals Ax0–Ax9 of the address decoder AD1601. This address signal is decoded by row predecoders RPD1601, and is outputted as row predecode signals $\overline{X0}\cdot\overline{X1}$, $X0\cdot\overline{X1}$, . . . . These signals are delivered also to spare row decoders RRD1801 of which detailed configuration will be described later. They are outputted as spare row decode signals from the spare row decoder RRD1801, and are delivered to the spare memory cell array.

In a column direction of the memory cell array NMA1501, a column decoder CD1501 and a section decoder SD1501 are provided in every section.

In FIG. 12, selection in the row direction of the memory cell MC is carried as follows. Row predecode signals are delivered to the row main decoder RMD1501. As a result, any one of 1024 normal main word lines NMW is selected. Further, any section is selected by the section decoder SD1501. As a result, the potential on a word line SW within that (selected) section rises.

Selection in a column direction is carried out in such a manner that any one of the bit lines is selected by the column decoder CD1501.

In the spare memory cell array RMW, spare memory cells of 8 rows are arranged. At the end portion of the spare memory cell array RMW, a spare word line buffer WB1501 for selecting a spare main word line RMW is provided. To the spare word line buffer WB1501, spare row decode signals generated by the above-mentioned spare row decoder RRD1801 shown in FIG. 14 are inputted.

The spare row decoder RRD1801 shown in FIG. 14 is a decoder of the type also disclosed in the Japanese Patent Application Laid Open No. 168900/1988 (Tokkaisho 63-168900), and is adapted so that the above-mentioned row predecode signals $\overline{X0}\cdot\overline{X1}$, $X0\cdot\overline{X1}$, . . . are inputted thereto. The inputted row predecode signals are inputted to a NAND circuit NA1801 through CMOS transmission gate circuits TG for switch each comprised of a P-channel transistor and an N-channel transistor connected in parallel. The switching conditions (ON/OFF states) of respective gates in the CMOS transmission gate circuit TG for switch are determined by output signals F, $\overline{F}$ from two sets of fuse selection circuits FS1801 and FS1802. Any one of the gates is opened by the signals F, $\overline{F}$. As a result, any one of four predecode signals is passed through that gate and is outputted therefrom.

There are provided a plurality of CMOS transmission gate circuits TG for switch. Respective output signals SP01i–SP89i are inputted to the NAND circuit NA1801. Further, to this NAND circuit NA1801, a spare enable signal SPEi from a spare enable signature circuit SES1701 for selecting any one of plural spare row decoders RRD1801 is inputted.

When the spare row decoder RRD1801 is not selected., the spare enable signal SPEi is at low level. As a result, a spare row decode signal of high level is outputted irrespective of the signals SP01i–SP89i. On the other hand, when the spare enable signal SPEi is at high a level, the level of the spare row decode signal is determined on the basis of signals SP01i–SP89i passed through the respective CMOS transmission gate circuits TG for switching.

The fuse selection circuit FS comprises, as shown in FIG. 15, a fuse FU1701, an inverter IN1701, capacitors C1701 and C1702, and an N-channel transistor N1701. The combination of the levels of signals F varies depending upon whether or not the fuse FU1701 is blown off. In the case where the fuse FU1701 is not blown off, the signal F is at a high level and the signal/F is at low level. Conversely, in the case where the fuse FU1701 is blown off, the signal F is at low level and the signal/F is at high level opposite to the above.

In SRAM having such a configuration, in the case where any one of normal rows is defective, a defective row isolation fuse FU1501 of the row where that defect exists is blown off by laser beams. Thus, even if an address signal which selects this defective row is inputted, an access to the defective row is not provided. In addition, since respective normal main word lines NMW are fixed to a high level by P-channel transistor P1501 of the normally on type as shown in FIG. 12, they maintain a non-selective state without being brought into a floating state.

When this defective row is selected, any spare row is instead automatically selected. For selecting any one of the spare rows, it is necessary to implement fuse blow operation to the fuse selection circuit FS of the spare row decoder RRD1801. As shown in FIG. 14, for selecting one spare row, it is necessary to carry out blowing of 11 fuses in total at the maximum of 10 fuses at the maximum for row predecode signals $\overline{X0} \cdot \overline{X1}$, $x0 \cdot \overline{X1}$, . . . , X8–X9 and one fuse for the spare enable signature circuit SES1701 for selecting the spare row decoder RRD1801.

Among these configurations, only the circuit configurations of the normal main word line(s) NMW and the spare main word line(s) RMW are shown in FIG. 16. As described above, to each of normal main word lines NMW of 1024 rows, a row main decoder RMD1901 comprised of a NAND circuit, a word line buffer WB1501, and a fuse FU1901 are serially arranged. At each of spare main word lines RMW of 8 rows, a word line buffer WB1901 is arranged. The normal main word line NMW and the spare main word line RMW are brought into a selective state when potential thereon are at the low level.

The configurations of the normal main word line NMW and the spare main word line RMW in other SRAM related to this invention are shown in FIG. 17. To the end portion of the normal main word line NMW, a row main decoder RMD2001, an inverter IN2002, a fuse FU2001, and an inverter IN2001 are serially connected. This configuration differs from the configuration shown in FIG. 16 in that fuse FU2001 is connected between inverters IN2001 and IN2002. In the case where the load capacity of the normal main word line NMW is large, a fuse FU having a resistance greater than that of the signal line is provided between inverters IN2001 and IN2002 of the word line buffer WB201, thereby permitting the charging/discharging speed to be higher.

At the node connecting the inverters IN2001 and IN2002, drains of N-channel transistors N2001 and N2002 are connected. Further, sources of the transistors N2001 and N2002 are grounded. The transistor N2001 is such that its gate is connected to the output node of the inverter IN2001, and the transistor N2002 is in a normally ON state. Although the transistor N2001 is not necessarily required, it has the role of providing feedback of the level of the normal main word line NMW 2001 to stably hold the level of the input node of the inverter IN2001. Further, the transistor N2002 is provided for the purpose of securely allowing the input node of the inverter IN2001 to be held at the low level in the case where the fuse FU2001 is blown off, and its drivability is set to a value sufficiently lower than that of transistors constituting inverters IN2001 and IN2002. The normal main word line NMW and the spare main word line RMW are brought into a selective state when potential thereon are at the low level.

The configurations of the normal main word line NMW and the spare main word line RMW in other SRAM are shown in FIG. 18. The normal main word line NMW and the spare main word RMW are brought into a selective state when potential thereon are at high level oppositely to those shown in FIGS. 16 and 17. For this reason, the number of stages of inverters provided at respective word lines is one unlike those in FIGS. 16 and 17. To the end portion of the normal main word line NMW, a row main decoder RMD2101 comprised of a NAND circuit, a word line buffer WB2102 comprised of a single inverter, and a fuse FU2101 are serially connected. To the end portion of the spare main word line RMW, a word line buffer WB2101 comprised of a single inverter is connected.

The configurations of the normal main word line NMW and the spare main word line RMW shown in FIG. 18 correspond to the configurations where the number of stages of inverters is set to one in the word line configurations shown in FIG. 16.

The configurations of the normal main word line NMW and the spare main word line shown in FIG. 19 correspond to the configurations where the number of stages of inverter is set to one in the word line configurations shown in FIG. 17. The normal main word line NMW and the spare main word line shown in FIG. 19 are brought into a selective state when the potential thereon are at a high level similarly to the configuration shown in FIG. 18.

The above-described redundancy circuits are all provided in a row direction. On the contrary, there exist configurations where a redundancy circuit is provided in a column direction. Such a configuration is effective for the purpose of preventing a delay of a word line propagation time and reducing power consumption at the time of operation.

The configuration of a SRAM where normal columns and spare columns are arranged in respective sections SEC91–SEC9N is shown in FIG. 20. Further, the configuration of a SRAM where sections are arranged in such a manner divided into sections SEC1001–SEC100N comprised of only normal columns and sections SEC100N+1 comprised of only spare columns is shown in FIG. 21.

In the circuit shown in FIG. 20, the core region is divided into N sections SEC91–SEC9N, and a memory cell array MCA91, a sense amplifier and write circuit SAW91, and a column gate CG91 are provided within each section.

The memory cell array MCA 91 is comprised of eight I/01–I/08. Each I/O includes n number of normal columns and s number of spare columns. Thus, s number of normal columns can be relieved every I/O. As the entirety of SRAM, 8.s.N spare columns are arranged.

In the circuit shown in FIG. 21, only normal columns are arranged in normal sections SEC1001–SEC100N, and spare columns are arranged in a spare section 100N+1. In the spare section 100N+1, eight I/01–I/08 are constructed. Further, s number of spare columns are arranged at respective I/O.

In the circuits respectively shown in FIGS. 20 and 21, isolation in the case where there is any defect in the normal columns is carried out by using a control signal without the use of a fuse. As a control signal, a section decode signal S for selecting the section, a column decode signal C for selecting the column, a column gate signal CG for controlling opening/closing operations of the column gates CG91, CG101, a common bit line select signal CBL for selecting a common bit line, a spare decode signal SPD delivered to a spare decoder, and a spare hit signal SPH indicating that the spare column is selected are used.

Among these control signals, the column decode signal C, the section decode signal S, and the spare hit signal SPH are generated by a circuit as shown in FIG. 22. To a column address input buffer CAB, m number of column address input signals CAI are inputted. Outputs of the column address input buffer CAB are delivered to a column decoder CD 1101, and are outputted as H number of column decode signals C. In addition, outputs of the column address input buffer CAB are delivered also to a fuse selection circuit FS1101. Outputs of the fuse selection circuit FS1101 are delivered to a spare column decoder SCD1101.

On the other hand, n number of section address input signals for selecting the section are inputted to a section address input buffer SAB. Outputs from the buffer SAB are delivered to a section decoder SD1101. As a result, N number of section decode signals S are outputted therefrom. Further, outputs from the section address input buffer SAB are delivered to a fuse selection circuit FS1102. Outputs from the fuse selection circuit FS1102 are delivered to a spare section decoder SSD1101. In this example, the fuse selection circuits FS1101 and FS1102 have a configuration as shown in FIG. 15 similarly to the fuse circuit FS1801 shown in FIG. 14.

As shown in FIG. 22, outputs of the spare column decoder SCD1101 and the spare section decoder SSD1101 are delivered to an AND circuit AND1101, and an output signal SPD(1) of the AND circuit AND1101 is delivered to an OR circuit OR1101. To the OR circuit 1101, s number of such output signals from the AND circuit, which is the number of spare columns, are inputted. This OR circuit OR1101 outputs a single spare hit signal SPH.

An increase of the memory cell array region resulting from the fact that a redundancy circuit is provided in the circuit shown in FIG. 20 and the number of necessary decoders of spare columns are as follows. As described above, since the number of spare columns is 8.s.N, the rate of an increase of the memory cell array region is expressed as (8.s.N)/(8.n.N)=s/n. In addition, s.N number of decoders for spare columns are required.

In the circuit shown in FIG. 21, the increasing rate of the memory cell array region is 1/N and s number of column decoders for spare columns are required.

When it is now assumed that a normal memory cell array of 1024 rows is provided and a spare memory cell array of eight rows is added thereto, the area is increased by 0.8% on the basis of the relationship expressed as 1032/1024=1.008.

(2) Increase of an area by addition of defective row isolation fuse

It is necessary to provide 1024 fuses which have the same number as the 1024 normal rows between the memory cell array and the word line buffer. These fuses must be disposed in the vicinity of the memory cell array. However, in order not to damage fuses and-circuits or wiring therearound in carrying out blowing by laser beams, a distance of about 100 μm is required between fuses and circuits or wiring. The area is increased by a quantity corresponding to this distance.

(3) Increase of an area by addition of a transistor in normally ON state

This transistor may be constituted with a MOS type transistor having an extremely low drivability, or a high resistance element. An increase in the area corresponding to several columns in terms of array only takes place.

(4) Increase of an area by addition of the spare row decoder

In the spare row decoder shown in FIG. 14, the number of spare rows is 11×8, and nine sets of decoders including 88 fuses are required. As an approximation, the area of one spare row decoder necessary for one spare row is about 20000 μm². Thus, if eight spare row decoders are provided, there would result an increase in the area of about 160000 μm².

The number of the fuse blow operations increased by employment of the redundancy circuit configuration will now be described. In Table 1, the number of fuse blow operations relating to the spare row in a SRAM of 64 K bits to a SRAM of 16 M bits is shown.

TABLE 1

| | | NO. OF FUSE BLOW | | | |
|---|---|---|---|---|---|
| | | PRIOR ART | | | EMBODIMENT |
| SRAM BIT DENSITY | SPARE ROW NO./NORMAL ROW NO. | DEFECTIVE ROW ISOLATION FUSE BLOW | DEFECTIVE ADDRESS PROGRAM FUSE BLOW* | TOTAL | TOTAL (ONLY DEFECTIVE ISOLATION FUSE BLOW) |
| 64K SRAM | 2/256 | MAX. 2 | MAX. 18 | MAX. 20 | MAX. 2 |
| 256K SRAM | 4/512 | MAX. 4 | MAX. 40 | MAX. 44 | MAX. 4 |
| 1M SRAM | 8/1024 | MAX. 8 | MAX. 88 | MAX. 96 | MAX. 8 |
| 4M SRAM | 16/2048 | MAX. 16 | MAX. 192 | MAX. 208 | MAX. 16 |
| 16M SRAM | 32/4096 | MAX. 32 | MAX. 416 | MAX. 448 | MAX. 32 |

* = [$\log_2$ (normal row No.) + 1] × (spare row No.)

In the above-described device, in the case where the device is caused to have a redundancy circuit, elements as described below must be added as compared to the device including no such redundancy circuit:

(1) Spare memory cell array and word line buffer
(2) Defective row isolation fuse
(3) Transistor in a normally ON state provided so that the normal main word line after the fuse is blown off is always in non-selective state, without being brought into floating state.
(4) Spare row decoder Approximation of the rate where the area is increased by addition of such elements is as follows.

(1) Increase of an area by addition of the spare memory cell array and the word line buffer Spare rows are provided at a rate of one row to 128 normal rows. By taking an example of 64 Kbit SRAM, two spare rows are provided with respect to 256 normal rows. The number required for blowing a defective row isolation fuse is 2 at the maximum. In the spare row decoder in this case, sum of the number of fuse blow operations required for storing addresses of defective rows and the fuse blow operations for spare row enable is 18 at the maximum. Thus, sum total of the number of fuse blow operations is equal to 20 at the maximum.

As apparent from the Table 1, a greater part of the number of fuse blow operations is occupied by the number of fuse blow operations for storing addresses of defective rows and the number of fuse blow operations for spare row enable. With realization of SRAMs of high capacity, the number of blow operations increases to a large degree.

Explanation has been given in connection with increases of the area and the manufacturing process steps by employment of a redundancy circuit configuration in a row direction. Now, increases of the area and the manufacturing process steps in the case where a SRAM is caused to similarly have a redundancy circuit in a column direction will be described.

As described above, in the circuit configuration shown in FIG. 20, the rate of an increase of the area resulting from the fact that a spare memory cell array is provided is s/n. On the other hand, in the case of the circuit configuration shown in FIG. 21, such a rate is equal to 1/N.

Since a fuse for isolation of a defective column is not used, an increase of the area based thereon is zero. Similarly, since a transistor in a normally ON state is not added, there is no increase of the area based thereon.

In the configuration of FIG. 20, s×N number of spare column decoders are required. On the other hand, in the configuration of FIG. 21, s number of spare column decoders are required. When it is assumed that 1024 normal columns and eight spare columns are provided in 1 M bit SRAM of the 8 I/O configuration, a column address required for decoding is 7 bits, so an area of about 15000 μm² per one spare column is increased. Thus, eight spare column decoders are required as a whole, so an area of about 120000 μm² is increased.

The number of fuse blow operations resulting from the fact that the device is caused to have a redundancy circuit with respect to the column direction is shown in Table 2.

In accordance with this invention, there is provided a semiconductor memory device comprising: a plurality of blocks in which memory cells are respectively arranged on a plurality of normal rows and one spare row; a plurality of normal row selection lines respectively provided for selecting any one of the normal rows within the respective blocks; one spare row selection line respectively provided for selecting instead the spare row in the case where any one of the normal rows is defective within the respective blocks; non-selection means provided for every normal row selection line and adapted so that when a corresponding normal row is defective, the non-selection means allows that defective normal selection line to be placed in a non-selective state; and selector means adapted so that when all the normal rows within a corresponding block are in the non-selective state within the respective blocks, the selector means allows that spare row selection line to be placed in selective state.

In the case where any one of normal rows is defective within respective blocks, this defective normal row selection line is placed in non-selective state. Further, in the case where that defective normal row selection line is selected, all normal row selection lines are placed in non-selective state, and the spare row selection line is instead placed in selective state. As stated above, a plurality of normal rows and one spare row are provided within each block. In the case where any normal row is defective, the spare row is automatically placed in a selective state. For this reason, a decoder for the spare row for selecting the spare row and/or means for storing information for selecting the spare row become

TABLE 2

| | | NO. OF FUSE BLOW | |
|---|---|---|---|
| SRAM BIT DENSITY (8 BIT SRAM) | SPARE COLUMN NO./NORMAL COLUMN NO | PRIOR ART TOTAL (ONLY DEFECTIVE ADDRESS PROGRAM FUSE BLOW*) | EMBODIMENT TOTAL (ONLY DEFECTIVE COLUMN ISOLATION FUSE BLOW) |
| 64K SRAM | 2/256 | MAX. 12 | MAX. 2 |
| 256K SRAM | 4/512 | MAX. 28 | MAX. 4 |
| 1M SRAM | 8/1024 | MAX. 64 | MAX. 8 |
| 4M SRAM | 16/2048 | MAX. 144 | MAX. 16 |
| 16m SRAM | 32/4096 | MAX. 320 | MAX. 32 |

* = [log₂ (normal column No.) − 2] × (spare column No.)

Similarly to the row direction shown in Table 1, spare columns are provided at a rate of one column to 128 normal columns. As apparent from the Table 2, the number of blow operations will increase to a large degree with realization of a device of high capacity although such an increasing rate is not much higher than that in the case where spare rows are provided.

As described above, when a redundancy circuit configuration is employed, an area is increased and the number of manufacturing process steps also increases to a large degree. Thus, there result in an increase of the chip size and an increase of the manufacturing time and/or the manufacturing cost.

SUMMARY OF THE INVENTION

Accordingly, an object of this invention is to provide a semiconductor memory device capable of suppressing an increase of the chip area, and reducing the number of processes for storing information required for selecting spare rows or spare columns.

unnecessary. Thus, the chip area can be reduced. Further, the process for storing information to select the spare row is unnecessary. In addition, also in the case where similar configuration is provided with respect to the column direction, similar effects are obtained.

DESCRIPTION OF THE PREFERRED EMBODIMENTS

Preferred embodiments of this invention will now be described with reference to the attached drawings.

Figure 1:
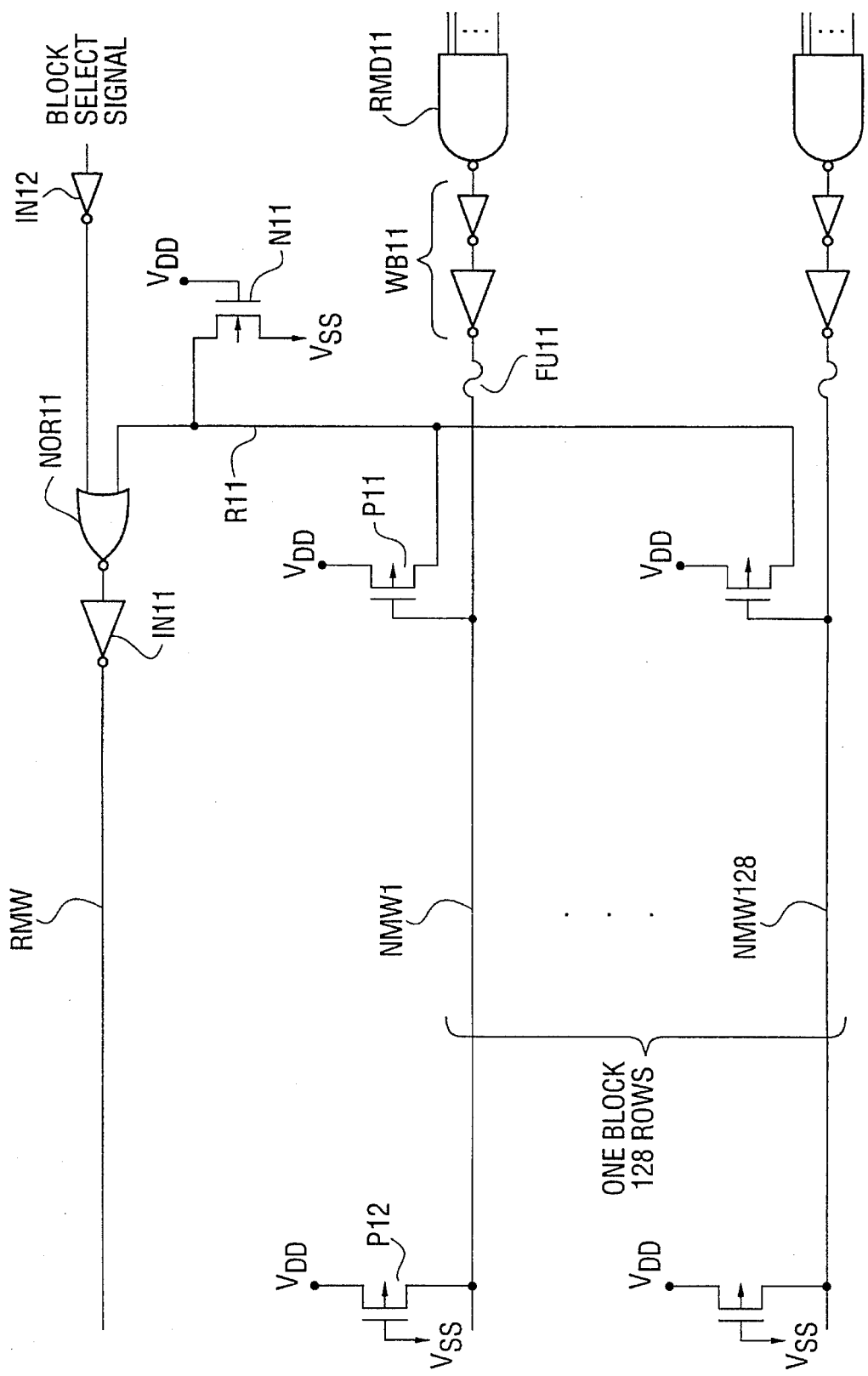
FIG. 1 is a circuit diagram showing the configuration of a semiconductor memory device according to a first embodiment of this invention.
Figure 16:
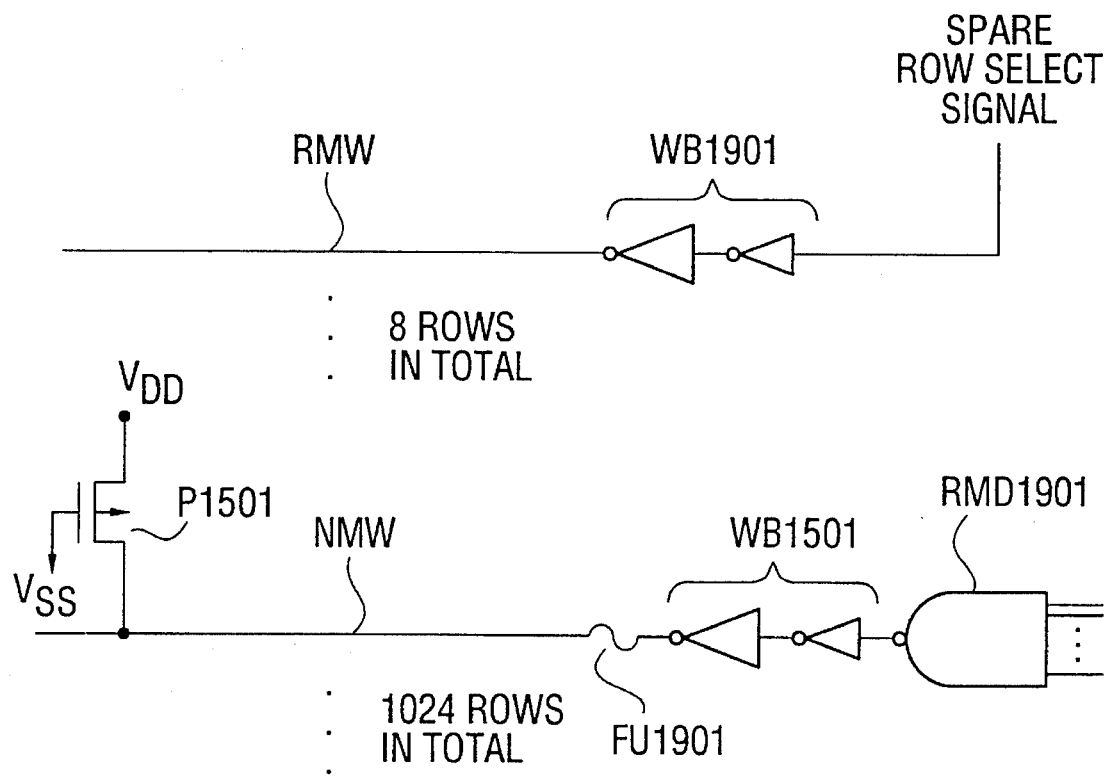
FIG. 16 is a circuit diagram showing the configuration in a row direction in the above-mentioned semiconductor memory device.

The configuration in a row direction within one block in a semiconductor memory device according to a first embodiment of this invention is shown in FIG. 1. The semiconductor memory device of the first embodiment corresponds to a semiconductor memory device in which this invention is applied to the device shown in FIG. 16.

Within each block, 128 normal main word lines NMW1–NMW128 and a single spare main word line RMW are arranged.

To the end portion of each normal main word line NMW, a row main decoder RMD11 comprised of a NAND circuit, a word line buffer WB11 comprised of two stages of inverters, and a defective row isolation fuse FU11 are serially connected. Further, at the other end portion of each of the normal main word lines NMW1–NMW128, a P-channel transistor P12 of the normally ON type having a small drivability is provided.

To the end portion of the spare main word line RMW, an inverter IN12, a NOR circuit NOR11, and an inverter IN11 are serially connected.

Further, a single common block line R11 is wired in a direction perpendicular to word lines. To the common block line R11, drains of P-channel transistors P11 respectively provided at intersecting points of the common block line R11 and respective normal main word lines NMW1–NMW128, drain of an N-channel transistor N11 and the other input terminal of the NOR circuit NOR11 are connected.

Sources of respective P-channel transistors P11 are connected to a power supply voltage VDD terminal, and their gates are connected to the respective normal main word lines NMW. The N-channel transistor N11 is in a normally ON state with its gate being connected to the power supply voltage VDD terminal. Further, its source is grounded. The drivability of the N-channel transistor N11 is set to a value sufficiently smaller than that of the P-channel transistor P11.

In the first embodiment thus constructed, the semiconductor memory device operates as follows. In the case where there is no defect on the normal main word lines NMW1–NMW128, or in the case where even if there is a defect on any normal word line, any other normal main word line NMW is selected, and only potential on the selected normal main word line NMW is caused to be at low level. As a result, only the P-channel transistors P11 of which gate is connected to the selected normal main word line NMW is turned ON to charge the spare selection line (common block line) R11. Thus, a signal of high level is inputted to the NOR circuit NOR11. As a result, the spare main word line RMW is held at high level irrespective of a block select signal inputted to the inverter INV12 to maintain the non-selective state.

In the case where there exists any defective on the normal main word lines NMW1–NMW128 and the defective normal main word line NMW is selected, this device operates as follows, so the defective normal main word line NMW is replaced by the spare main word line RMW.

For example, consideration is made in connection with the case where the normal main word line NMW1 of the normal memory cell array is defective, the defective row isolation fuse FU11 is blown off, and the defective normal main word line NMW1 is selected. When the defective row isolation fuse FU11 is blown off, the word line buffer WB11 and the row main decoder RMD11 and the normal main word line NMW1 are cut off. Thus, irrespective of row predecode signals inputted to the row main decoder RMD11, the normal main word line NMW1 is charged by the P-channel transistor P12 so that its potential is held at high level.

In the case where the normal main word line NMW1 is selected in this state, all normal main word lines NMW1–NMW128 are at high level, so they are placed in non-selective state. Thus, all P-channel transistors P11 are turned OFF. Since the N-channel transistor N11 is normally ON, the block common line R11 is brought into low level. This signal of low level is inputted to one input terminal of the NOR circuit NOR11. For this reason, the level of the spare main word line RMW is varied in dependency upon a block select signal inputted through the inverter IN12. When block select signal of high level is inputted to the inverter IN12, the spare main word line RMW is caused to be at low level. Thus, this line is selected.

As stated above, in the first embodiment, when the normal main word line NMW is selected within each block, any one of normal main word lines NMW is selected in dependency upon a row predecode signal. In the case where defect exists on any one of normal main word lines NMW, that defective isolation fuse is blown off, and in the case where the defective normal main word line NMW is selected, all normal main word lines NMW are brought into non-selective state irrespective of row predecode signals. Thus, the spare main word line RMW is automatically placed in selectable state. Further, in the case where that block is selected, the spare main word line RMW is selected.

Figure 2:
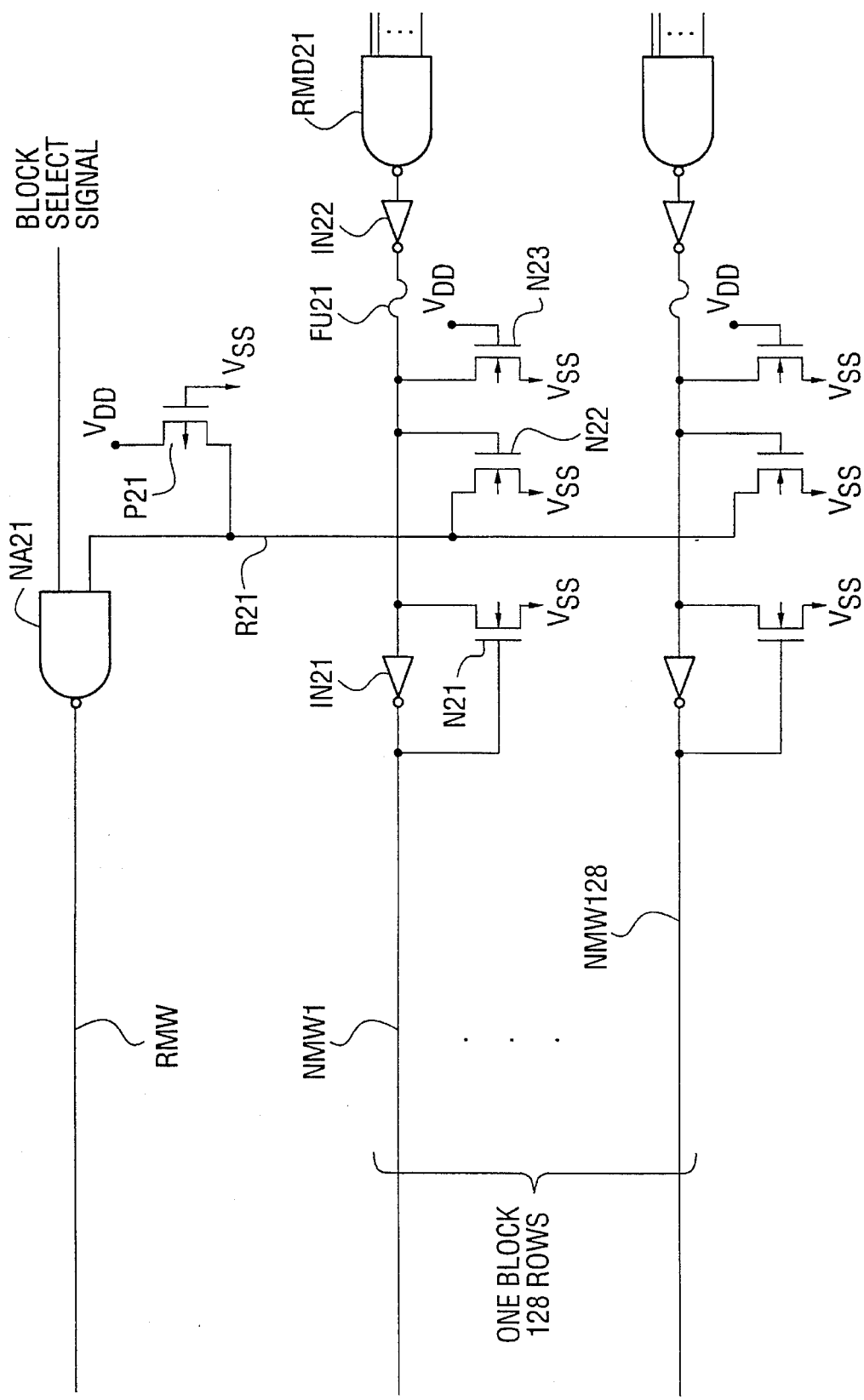
FIG. 2 is a circuit diagram showing the configuration of a semiconductor memory device according to a second embodiment of this invention.
Figure 17:
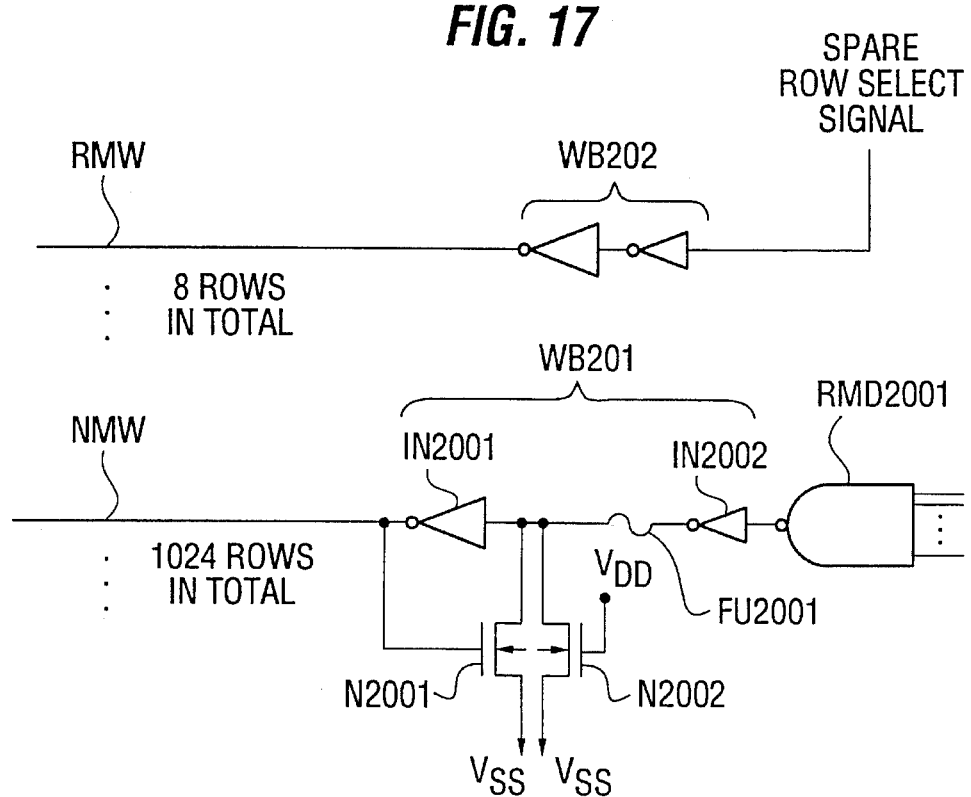
FIG. 17 is a circuit diagram showing the configuration in a row direction in another semiconductor memory device related to this invention.

The configuration of a semiconductor memory device according to a second embodiment of this invention is shown in FIG. 2. The semiconductor memory device of the second embodiment corresponds to the device in which this invention is applied to the conventional device shown in FIG. 17. Similarly to the device shown in FIG. 17, a row main decoder RMD21, an inverter IN22, a defective row isolation fuse FU21, and an inverter IN21 are connected in series with the end portion of each of normal main word lines NMW1–NMW128, and N-channel transistors N21 and N23 are further provided.

Further, the output terminal of the NAND circuit NA21 is connected to the end portion of the spare main word line RMW, and a block select signal is inputted to one input terminal of the NAND circuit NA21.

In a direction perpendicular to word lines, a block common line R21 is provided. Its one end is connected to the other input terminal of the NAND circuit NA21. At portions where this block common line R21 and respective normal main word lines NMW1–NMW128 intersect with each other, N-channel transistors N22 are respectively provided. Drains of respective N-channel transistors N22 are connected to the block common line R21, their sources are grounded, and their gates are connected to input terminals of respective inverters IN21. In addition, the drain of a normally ON P-channel transistor P21 having a drivability sufficiently smaller than that of the N-channel transistor N22 is connected to the block common line R21.

In the case where there is no defect on any one of normal main word lines NMW1–NMW128, or in the case where even if there exists any defective portion, any other normal main word line is selected, the input terminal of the inverter IN21 of the selected row is caused to be at high level, and normal main word lines NMW are caused to be at low level. As a result, the N-channel transistor N22 of which gate is connected to the input terminal of the inverter IN21 of the selected row is turned ON to discharge the block common line R21. An input of low level is given from the block common line R21 to the NAND circuit NA21. Thus, the spare main word line RMW is held at high level at all times, and is placed in non-selective state.

In the case where there is defect on any one of normal main word lines NMW1–NMW128, the corresponding defective row isolation fuse FU21 is blown off. As a result, that defective normal main word line NMW is held at high level by N-channel transistors N21 and N23, and is placed in non-selective state. When the defective normal main word line NMW is selected, all N-channel transistors N22 maintain OFF state. Since the N-channel transistor P21 is normally ON, the block common line R21 is charged, so a potential thereon is caused to be at high level. When an input of high level is given to the NAND circuit NA21, the level of the spare main word line RMW varies in dependency upon a block select signal. When a block select signal of high level is inputted, the spare main word line RMW is caused to be at low level, and is placed in selective state.

Figure 3:
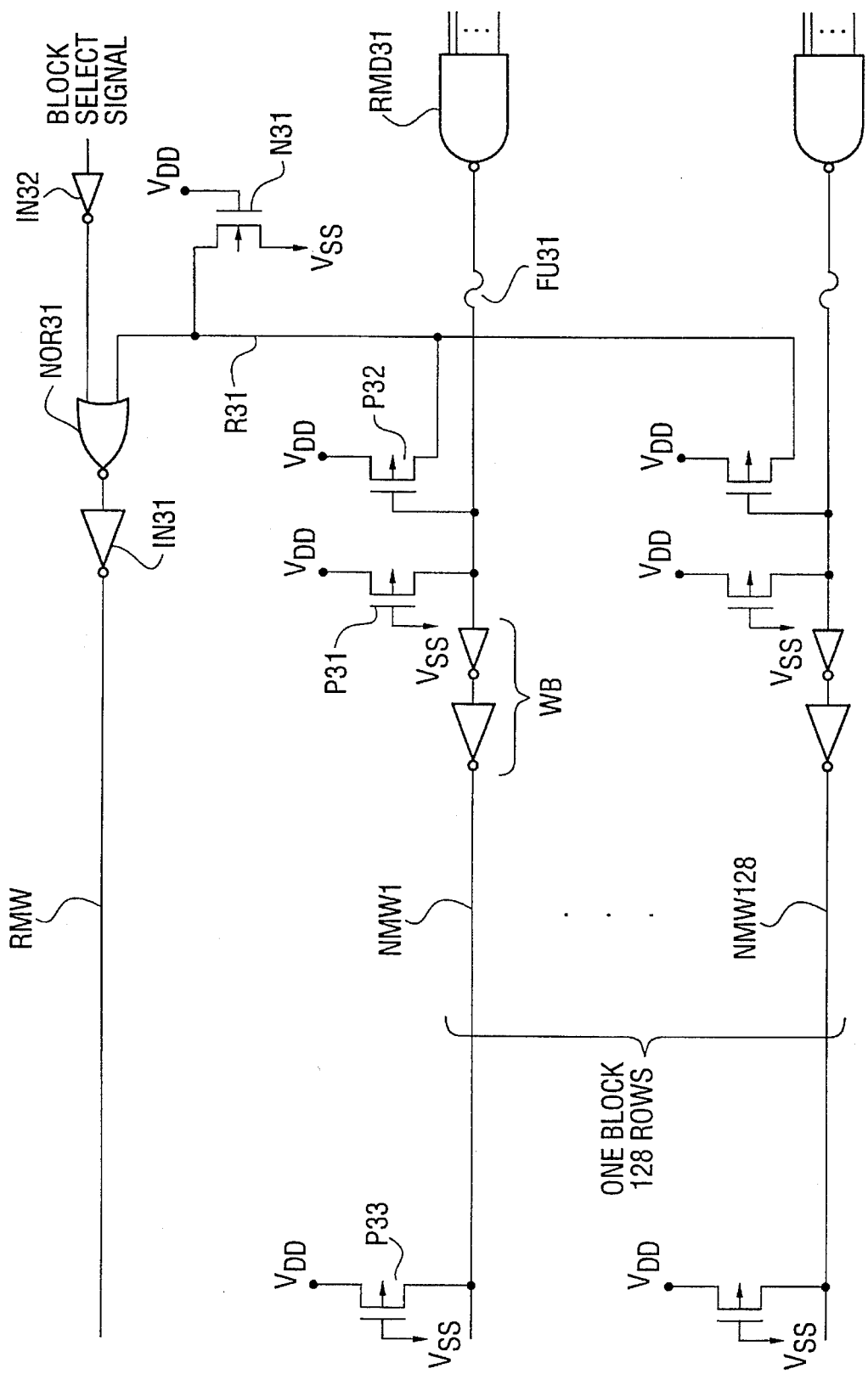
FIG. 3 is a circuit diagram showing the configuration of a semiconductor memory device according to a third embodiment of this invention.

The configuration of a semiconductor memory device according to a third embodiment of this invention is shown in FIG. 3. The configuration of this embodiment is similar to that of the first embodiment shown in FIG. 1. To the end portion of each of normal main word lines NMW1–128, a row main decoder RMD31, a defective row isolation fuse FU31, and a word line buffer WB comprised of two stages of inverters are serially connected. Further, between the node connecting the input terminal of the word line buffer WB and the output terminal of the row main decoder RMD31 and the power supply voltage VDD terminal, a P-channel transistor 31 is connected. The gate of this P-channel transistor P31 is grounded. Thus, this transistor is in normally ON state.

Further, to the end portion of the spare main word line RMW, an inverter IN32, a NOR circuit NOR31, and an inverter IN31 are serially connected.

In a direction perpendicular to word lines, a block common line R31 is provided. Its one end is connected to one input terminal of a NOR circuit NOR31.

In the case where there is no defect on any one of normal main word lines NMW1–NMW128, or in the case where even if there exists any defective portion, any other normal main word line is selected, and the selected ordinary main word line NMW is caused to be at low level. As a result, the P-channel transistor P32 of which gate is connected to the input terminal of the word line buffer WB of the selected row is turned ON when an input of low level is given to its gate to charge the block common line R31. An input of high level is given from the block common line R31 to the NOR circuit NOR31, Thus, the spare main word line RMW is always held at high level, and is placed in non-selective state.

In the case where any one of normal main word line NMW1–NMW128 is defective, that defective row isolation fuse FU21 is blown off. Thus, its normal main word line NMW is held at high level by P-channel transistor P31, and is placed in non-selective state. When a defective normal main word line NMW is selected, all P-channel transistors P32 maintain OFF state. Since the N-channel transistor N31 is normally ON, the block common line R31 is discharged and is caused to be at high level. An input of low level is given to the NOR circuit. NOR31. When a block select signal of high level is inputted, the spare main word line RMW is caused to be at low level, and is placed in selective state.

Figure 4:
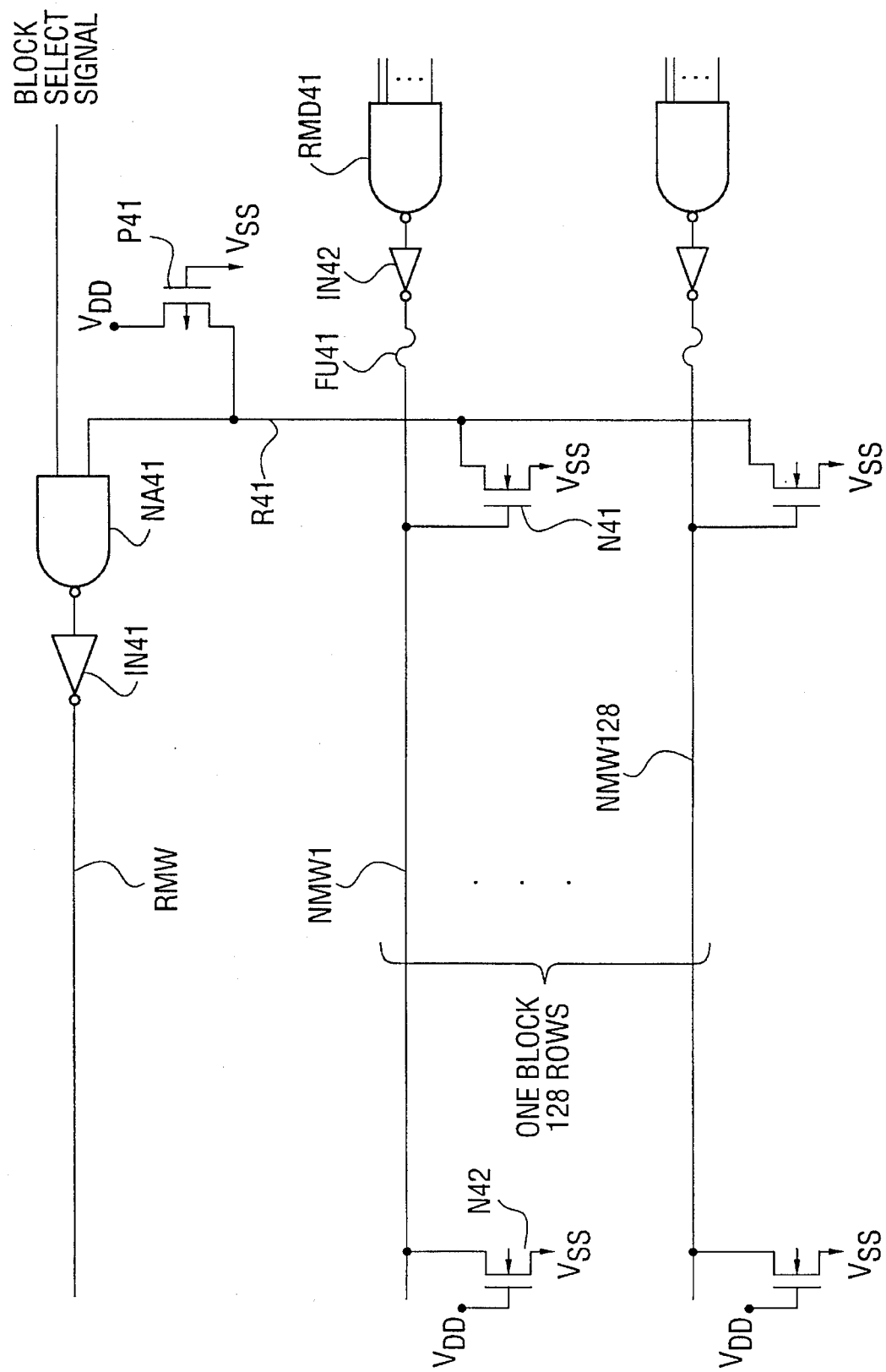
FIG. 4 is a circuit diagram showing the configuration of a semiconductor memory device according to a fourth embodiment of this invention.
Figure 18:
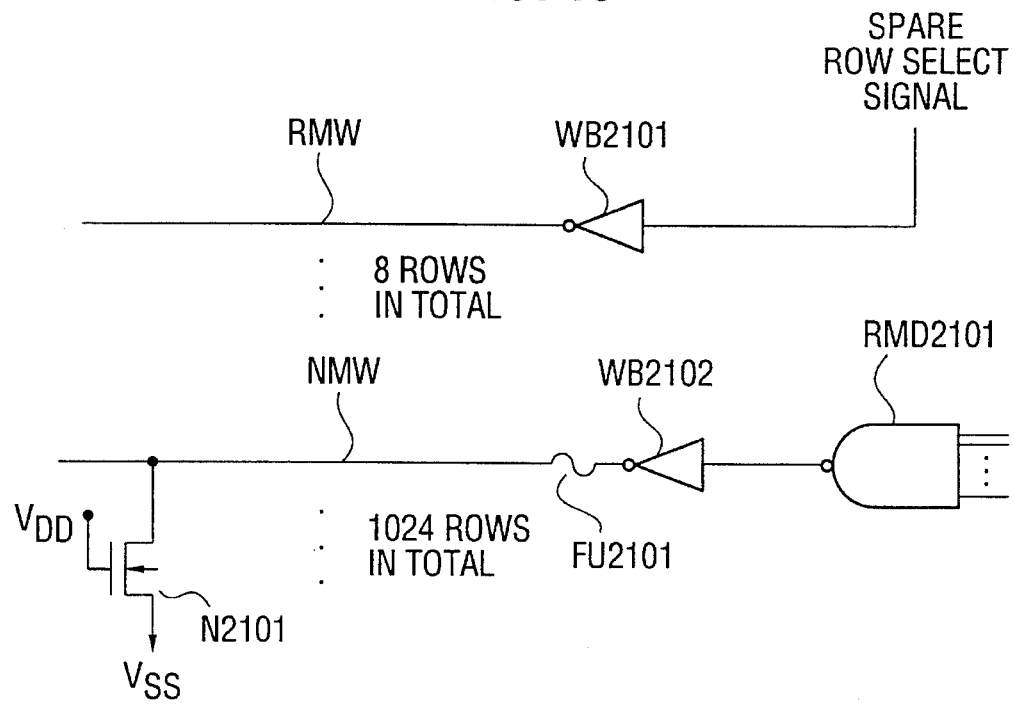
FIG. 18 is a circuit diagram showing the configuration in a row direction in a further semiconductor memory device related to this invention.

In a semiconductor memory device according to a fourth embodiment of this invention shown in FIG. 4, respective word lines are placed in a selective state when they are caused to be at high level oppositely to the above-described first to third embodiments. The device of this embodiment corresponds to the device in which this invention is applied to the conventional device shown in FIG. 18. In a direction perpendicular to normal main word lines NMW1–NMW128, a block common line R41 is provided, and N-channel transistors N41 are provided at respective intersecting points. In addition, the drain of a normally ON P-channel transistor P41 having a drivability sufficiently lower than that of the transistor N41 is connected to the block common line R41.

In the case where there is no defect on the normal main word lines NMW1–NMW128, or in the case where there exists any defect, a word line except for the defective is selected, and the selected normal main word line NMW is caused to be at high level. In this case, the N-channel transistor N41 of which gate is connected to the selected normal main word line NMW is turned ON. As a result, the block common line R41 is caused to be at low level. Thus, the spare main word line RMW is held at low level to maintain a non-selective state.

In the case where there is any defect on the normal main word lines, a corresponding fuse FU41 is blown off, that defective normal main word line NMW is selected, and all normal main word lines NMW1–NMW128 are held at low level. As a result, N-channel transistors N41 are all turned OFF, and since P-channel transistor P41 is of the normally ON type, the block common line R41 is caused to be at high level. When the block select signal is at high level and this block is selected, the spare main word line RMW is caused to be at high level, and is placed in a selective state.

Figure 5:
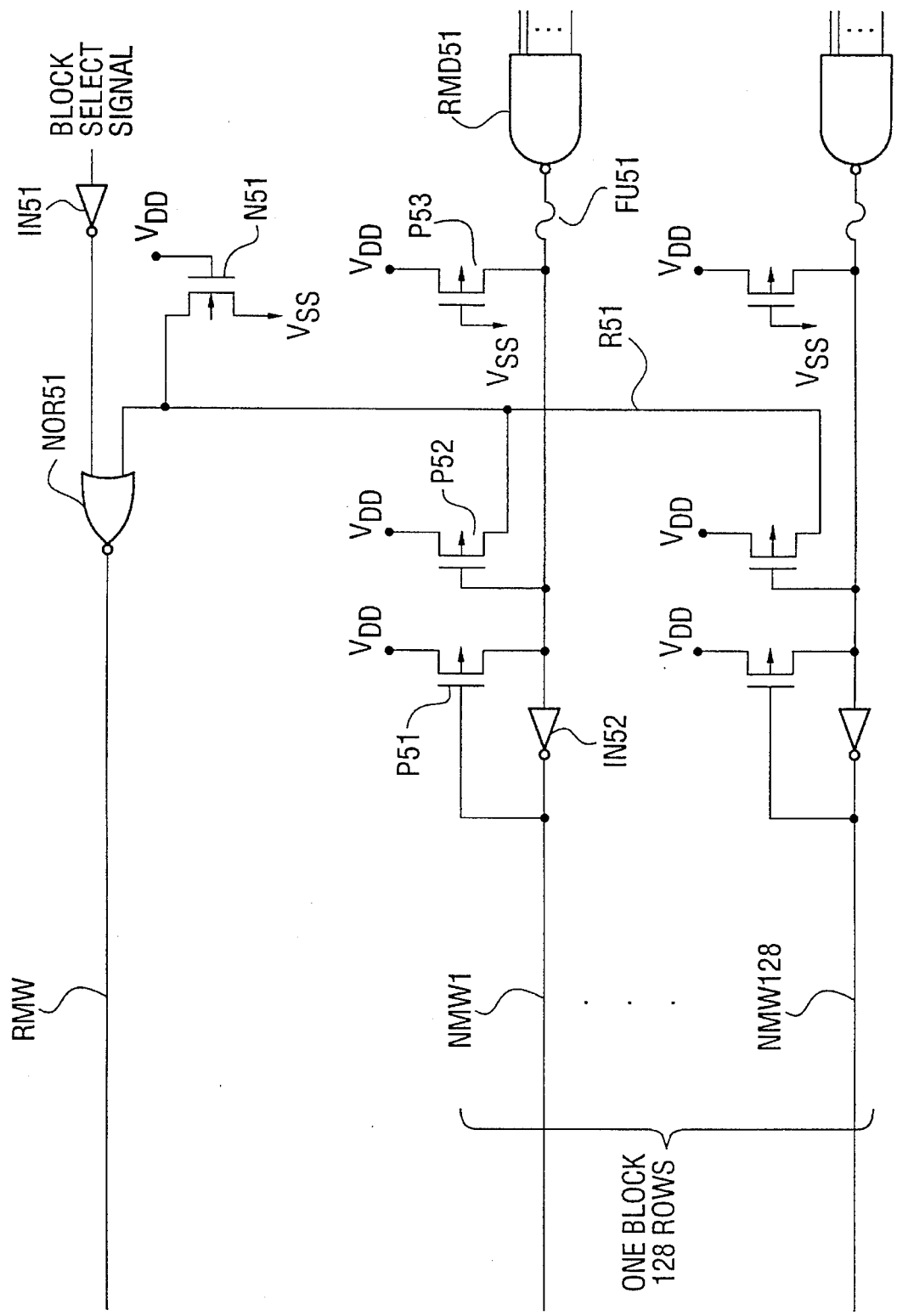
FIG. 5 is a circuit diagram showing the configuration of a semiconductor memory device according to a fifth embodiment of this invention.
Figure 19:
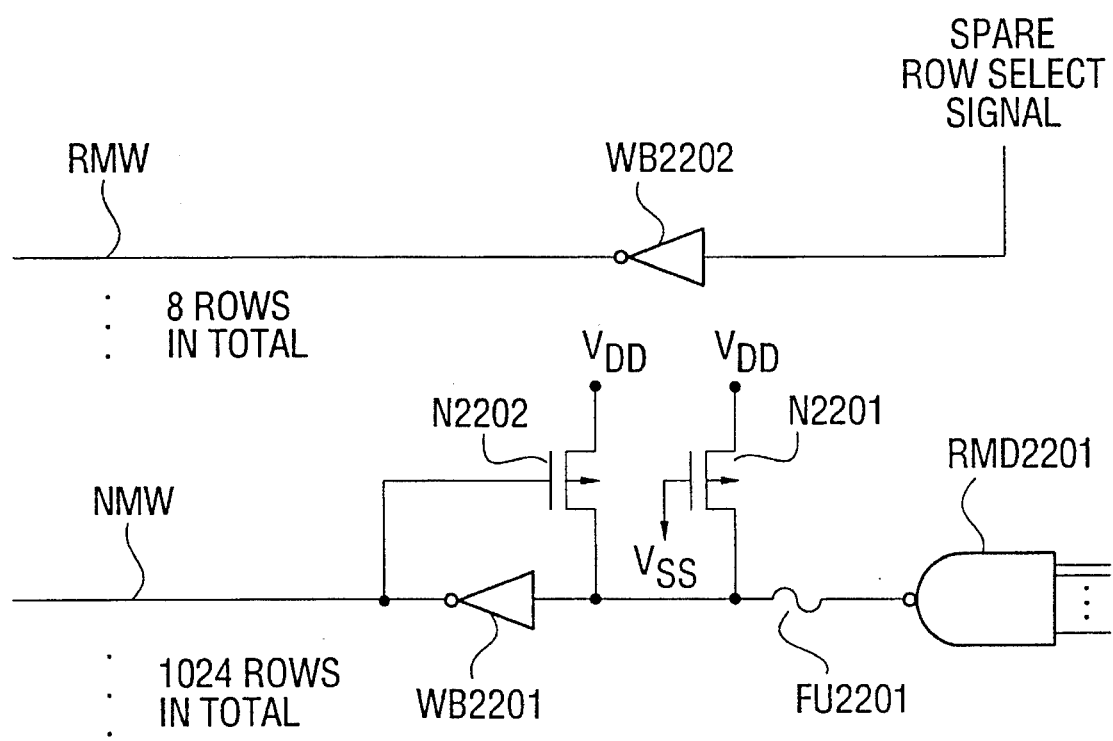
FIG. 19 is a circuit diagram showing the configuration in a row direction in a still further semiconductor memory device related to this invention.
Figure 20:
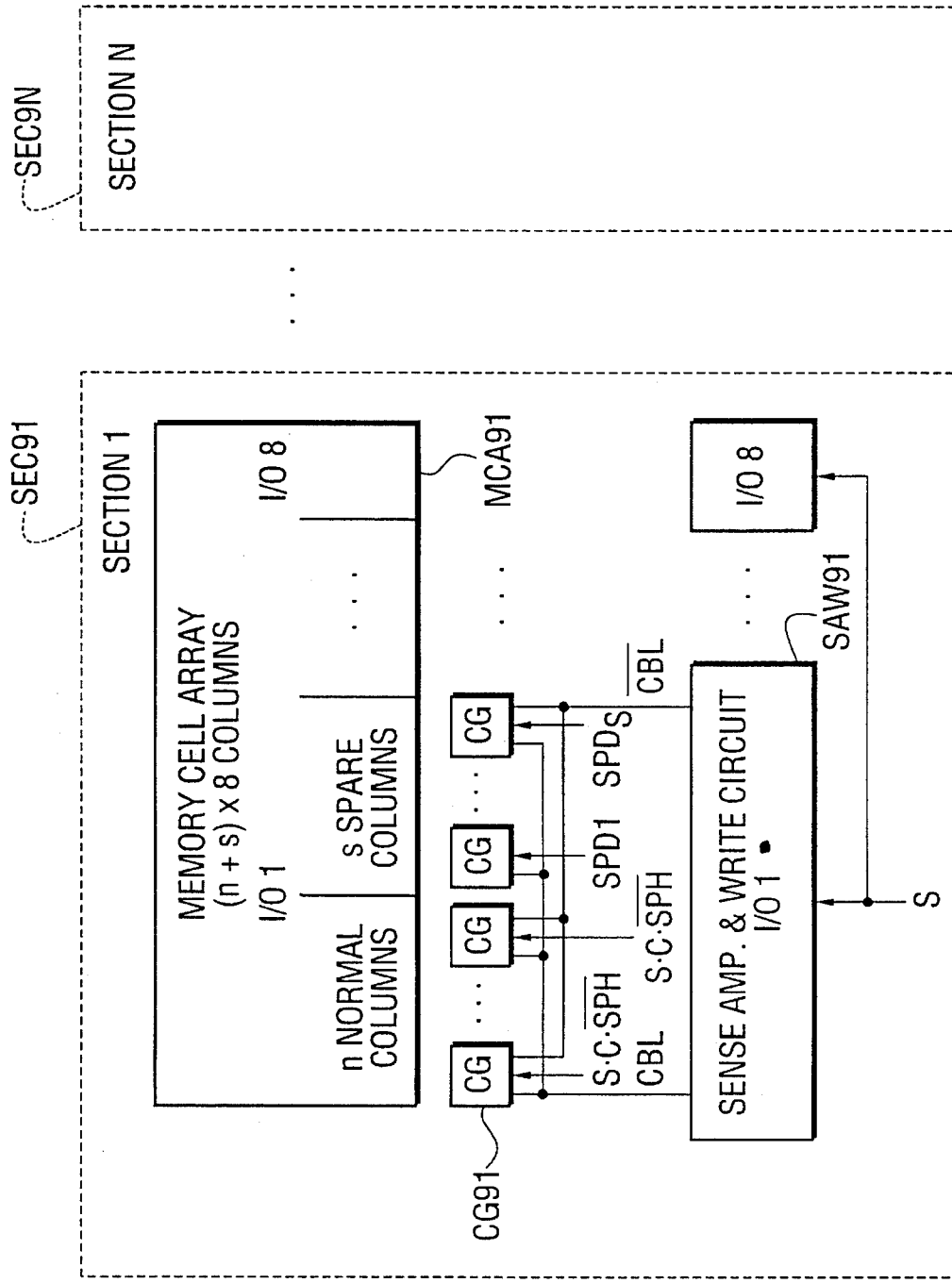
FIG. 20 is a circuit diagram showing the configuration in a column direction in a further semiconductor memory device related to this invention.
Figure 21:
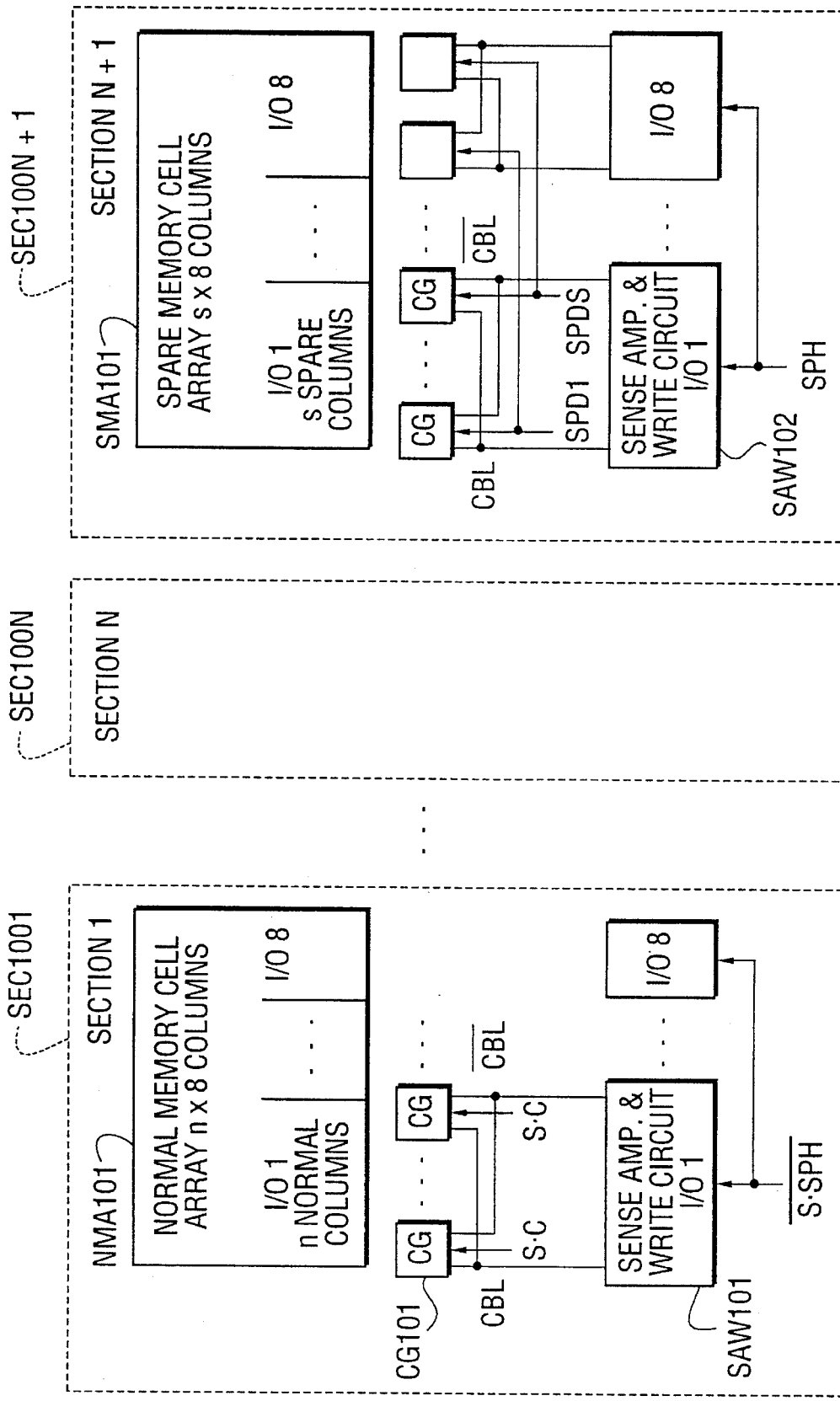
FIG. 21 is a circuit diagram showing the configuration in a column direction in a still further semiconductor memory device related to this invention.
Figure 22:
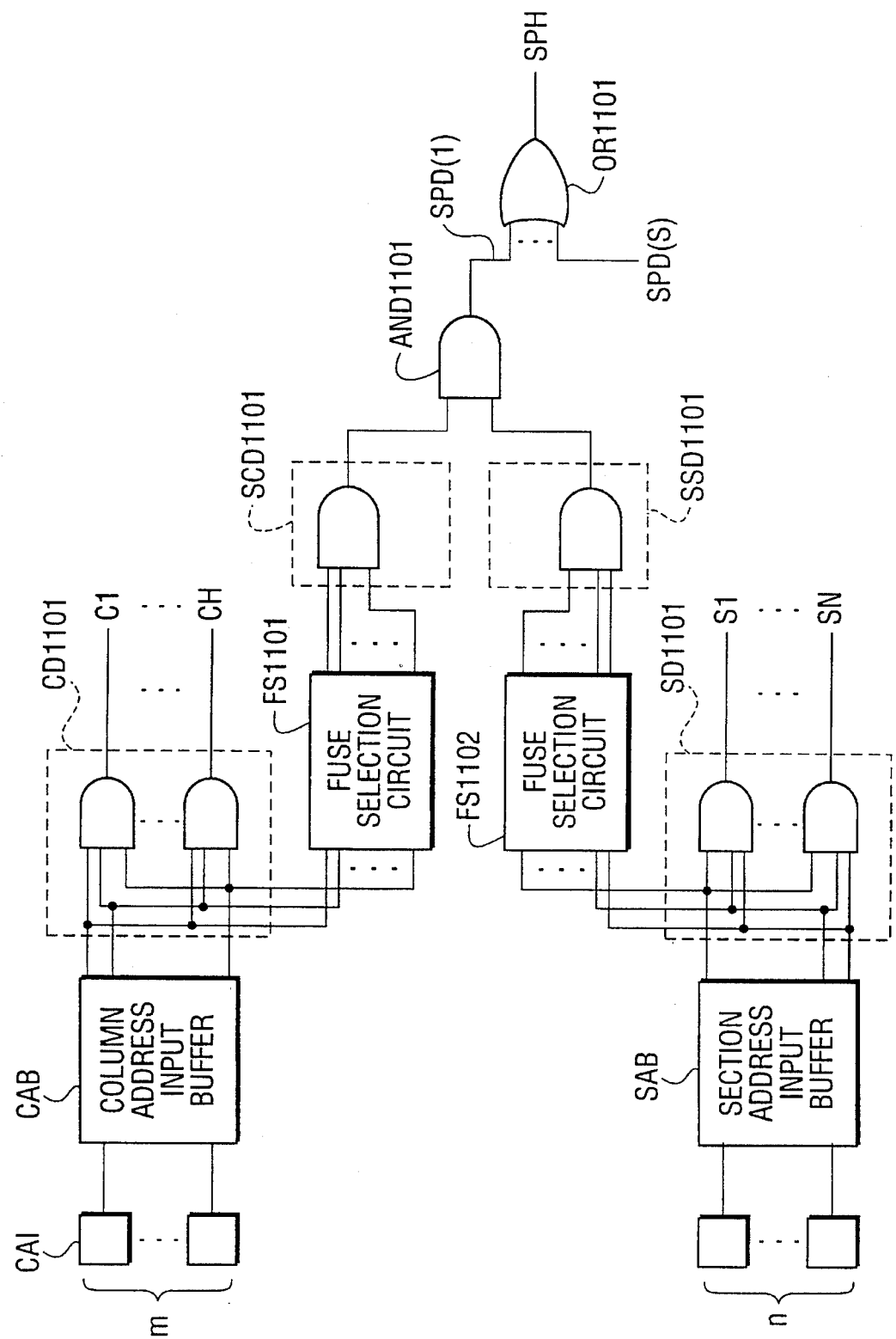
FIG. 22 is a circuit diagram showing the configuration of a circuit for generating a control signal in the above-mentioned semiconductor memory device.

The configuration of a device according to a fifth embodiment of this invention is shown in FIG. 5. Also in the fifth embodiment, similarly to the fourth embodiment, when potentials on respective word lines are caused to be at high level, they are brought into selective state. The device of this embodiment corresponds to the device in which this invention is applied to the conventional device shown in FIG. 19. At respective intersecting points of the block common line R51 and normal main word lines NMW1–NMW128, P-channel transistors P52 are provided. In addition, the drain of an N-channel transistor N51 of the normally ON type having a drivability sufficiently lower than that of the P-channel transistor P52 is connected to the block common line R51.

In the case where there is no defect on the normal main word lines NMW1–NMW128, or in the case where any defective exists, a word line except for the defective portion is selected, and the selected normal main word line NMW is caused to be at high level similarly to the fourth embodiment. Since P-channel transistor P52 of which the gate is connected to the input terminal of the inverter IN52 of the selected row is turned ON, the block common line R51 is caused to be at high level. Thus, the spare main word line RMW is held at low level to maintain a non-selective state.

When there is any defect on the normal main word lines NMW and the defective normal main word line NMW is selected, all normal main word lines NMW1–NMW128 are held at low level. P-channel transistors P52 are all turned OFF, and since N-channel transistor N51 is in ON state, the block common line R51 is caused to be at low level. When the block select signal is at low level and this block is selected, the spare main word line RMW is caused to be at high level, and is brought into a selective state.

Figure 6:
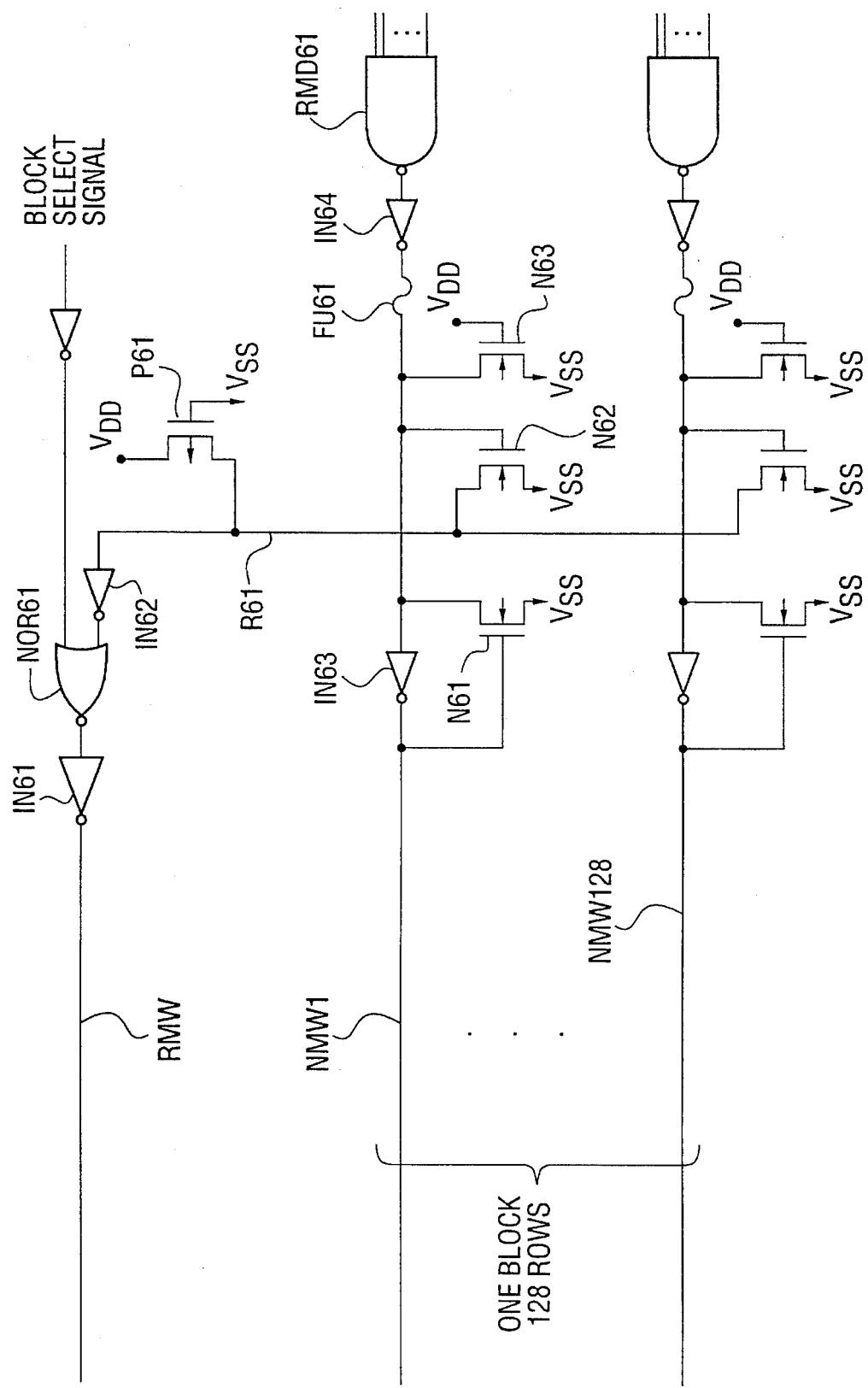
FIG. 6 is a circuit diagram showing the configuration of a semiconductor memory device according to a sixth embodiment of this invention.

A device according to a sixth embodiment of this invention shown in FIG. 6 corresponds to the device in which the polarities of respective transistors used in the fifth embodiment are changed. Namely, in place of P-channel transistors P51–P53 provided on respective normal main word lines NMW1–NMW128 and N-channel transistor N51 provided on the block common line R51, N-channel transistors N61–N63 and P-channel transistor P61 are respectively provided. Further, between the block common line R61 and one input terminal of the NOR circuit NOR61, an inverter IN62 is provided. The operation in the sixth embodiment is similar to that of the fifth embodiment. In the case where there is any defective on any one of normal main word lines NMW1–NMW128 and the defective row is selected, all normal main word lines NMW1–128 are caused to be at high level and are brought into a non-selective state. As a result, the block common line R61 is charged by the P-channel transistor P61. In the case where that block is selected, the spare main word line RMW is caused to be at low level and is brought into a selective state.

Here, all in the above-described first to sixth embodiments, when any one of normal main word lines NMW free from defect is selected, transistors connected to the selected word line NMW and normally ON transistor connected to each of the block common lines (R11–R61) are turned ON at the same time. As a result, a punch-through current flows from the power supply voltage VDD terminal to the ground voltage VSS terminal. However, since such a punch-through current flows only in a selected single block, the influence thereof is considered to be sufficiently small when viewed from a current consumption at the time of the operation of the entirety of the device.

Further, in the second embodiment shown in FIG. 2, for example, when an attempt is made to drive the block common line R21 by P-channel transistor P21 and N-channel transistor N22, the delay time is considered to be prolonged. However, if the drivabilities of the transistors P21 and N22 are set to a higher value, there results an increase in the above-described punch-through current. In view of this, a scheme is employed to provide an inverter IN61 as in the sixth embodiment shown in FIG. 6 to increase the number of stages in place of the method of driving the spare main word line RMW by a NAND circuit of one stage, thereby making it possible to reduce the load capacity of the block common line R61 to realize high speed operation.

Figure 7:
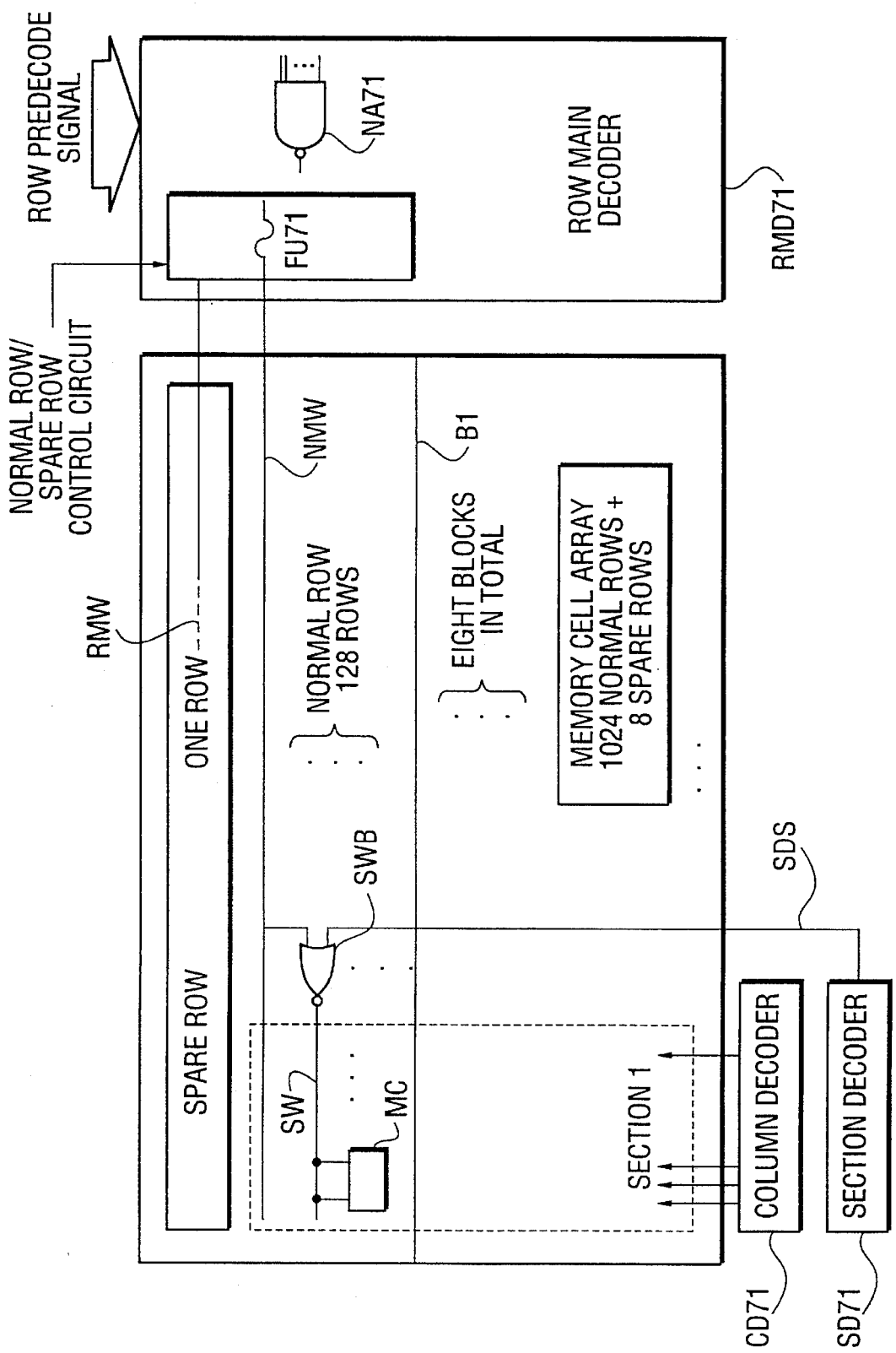
FIG. 7 is a circuit diagram showing the outline of the entire configuration of the semiconductor memory devices according to the first to sixth embodiments in this invention.

In the first to sixth embodiments described above, the configuration within one block is illustrated. As the entirety of the device, a configuration as shown in FIG. 7, for example, may be employed.

In one block B1, 128 normal main word lines NMW and a single spare main word line RMW are provided. As a whole, eight blocks of such configuration are provided. Accordingly, the number of normal main word lines NMW is 1024 and the number of spare main word lines RMW is 8.

Figure 12:
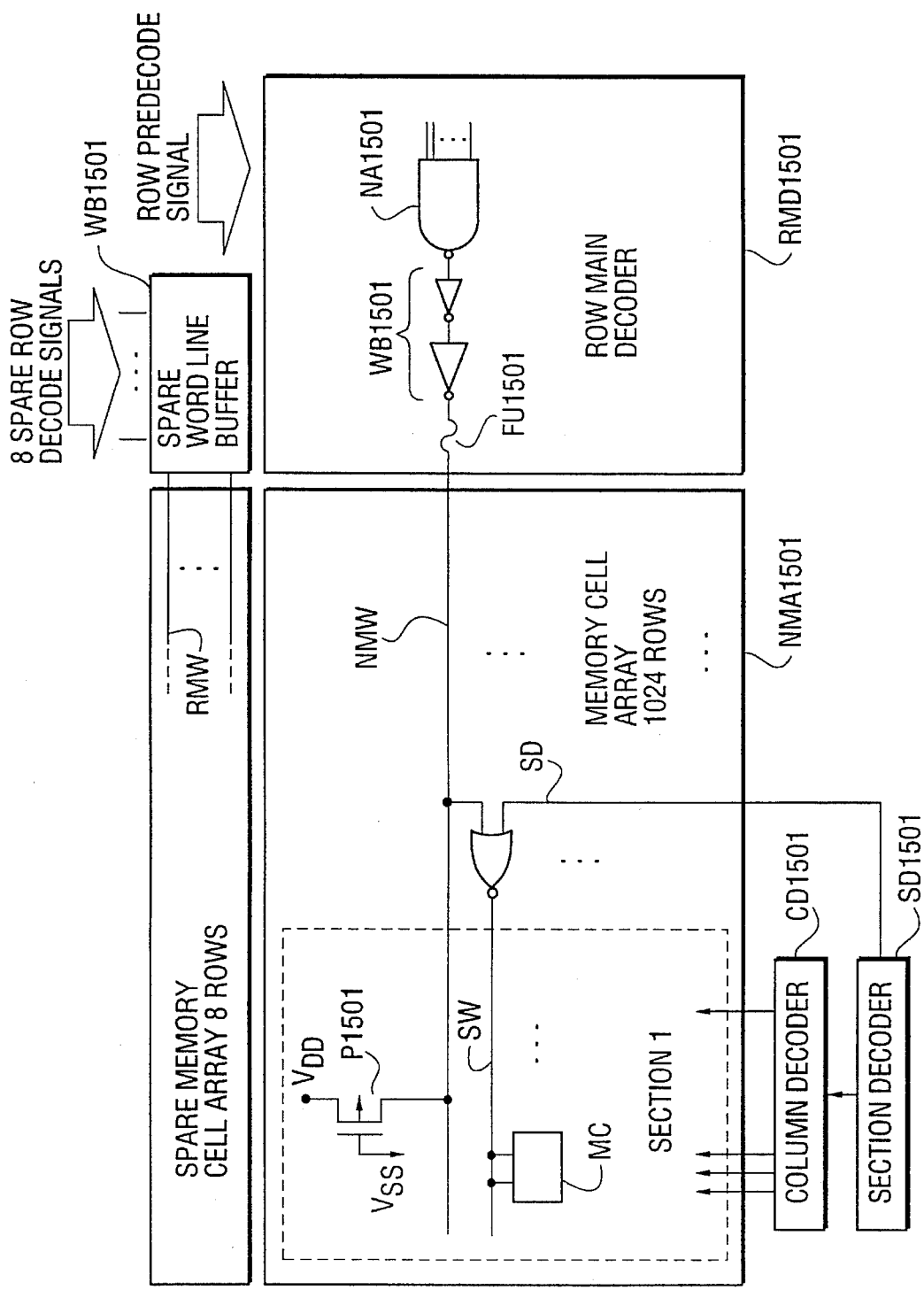
FIG. 12 is a circuit diagram showing the outline of the configuration of a semiconductor memory device related to this invention.
Figure 13:
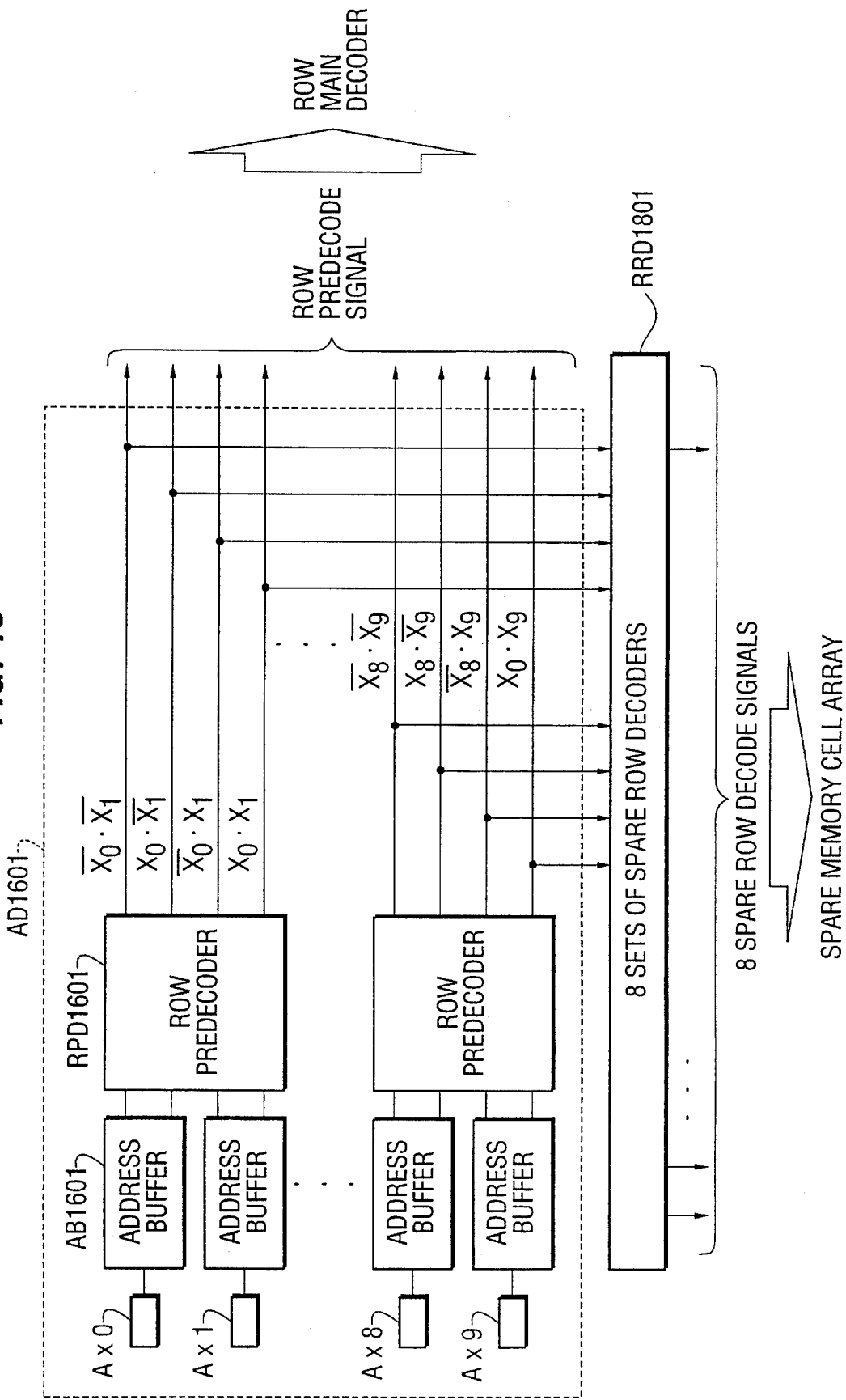
FIG. 13 is a circuit diagram showing the configuration of an address decoder in the above-mentioned semiconductor memory device.
Figure 14:
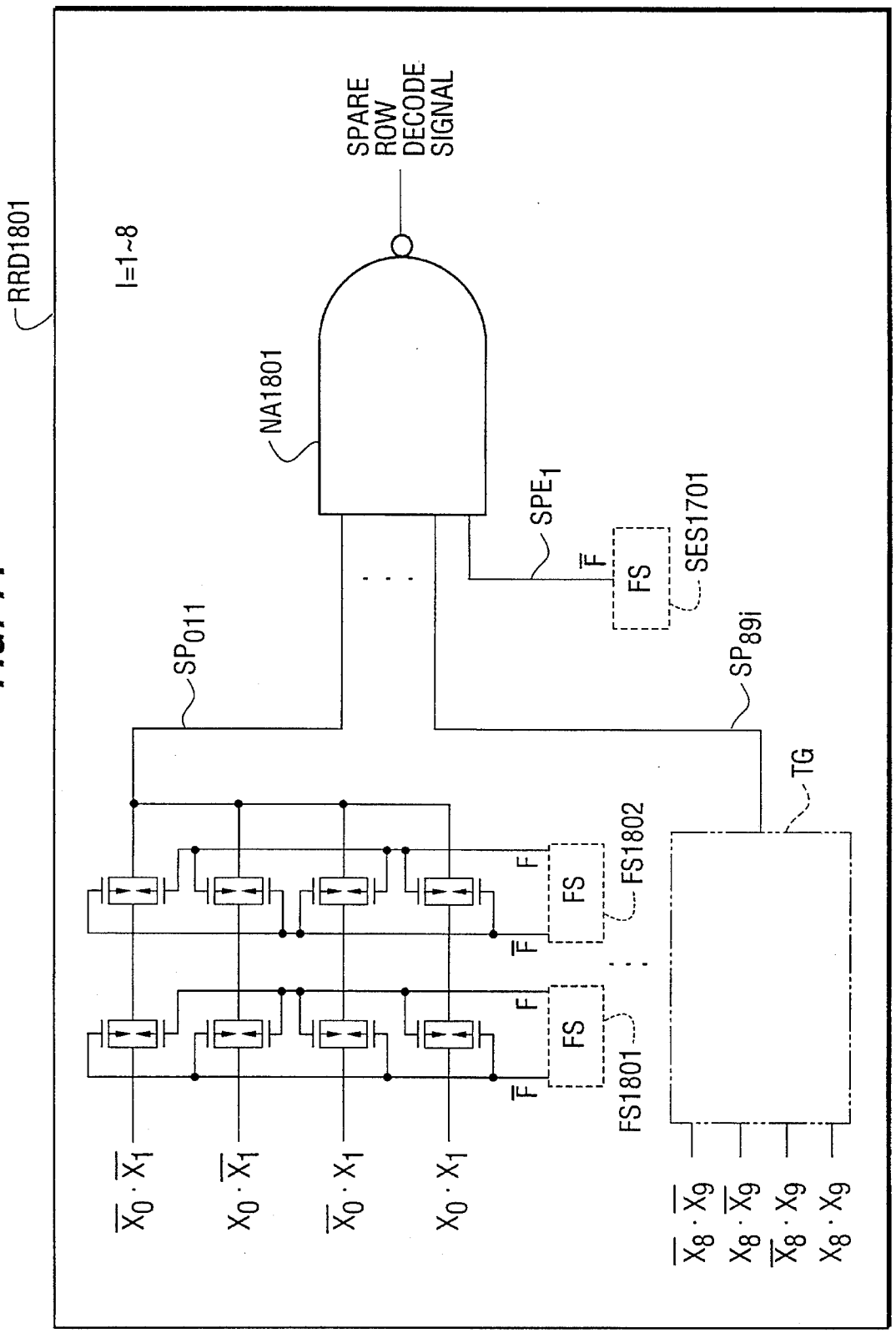
FIG. 14 is a circuit diagram showing the configuration of a spare row decoder in the above-mentioned semiconductor memory device.
Figure 15:
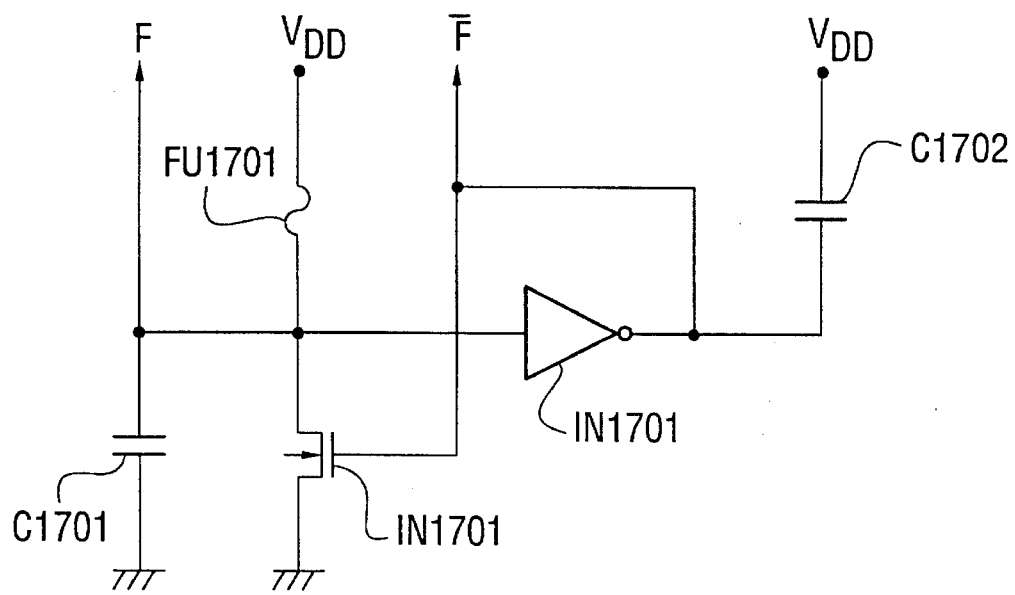
FIG. 15 is a circuit diagram showing the configuration of a fuse selection circuit in the above-mentioned semiconductor memory device.

While eight spare main word lines RMW and 1024 normal main word lines NMW are provided in separate regions in the device shown in FIG. 12, the entirety of the device is divided into plural blocks and one spare main word line arranged along with the normal main word lines NMW within respective blocks as described above in the device shown in FIG. 7.

Further, at the end portion of the spare main word line RMW, a circuit adapted for carrying out a control as described above (normal row/spare row control circuit) which has been described with reference to FIGS. 1–6 is arranged in place of the spare word line buffer. Further, it is unnecessary in the device shown in FIG. 7 to provide a spare row decoder for storing a spare row decode signal and address information for generating such a signal by using fuse, etc. which were required in the circuit shown in FIG. 12.

While circuits of the embodiments in which a redundancy circuit is provided in a row direction have been described above, a redundancy circuit may be provided similarly in a column direction.

Figure 8:
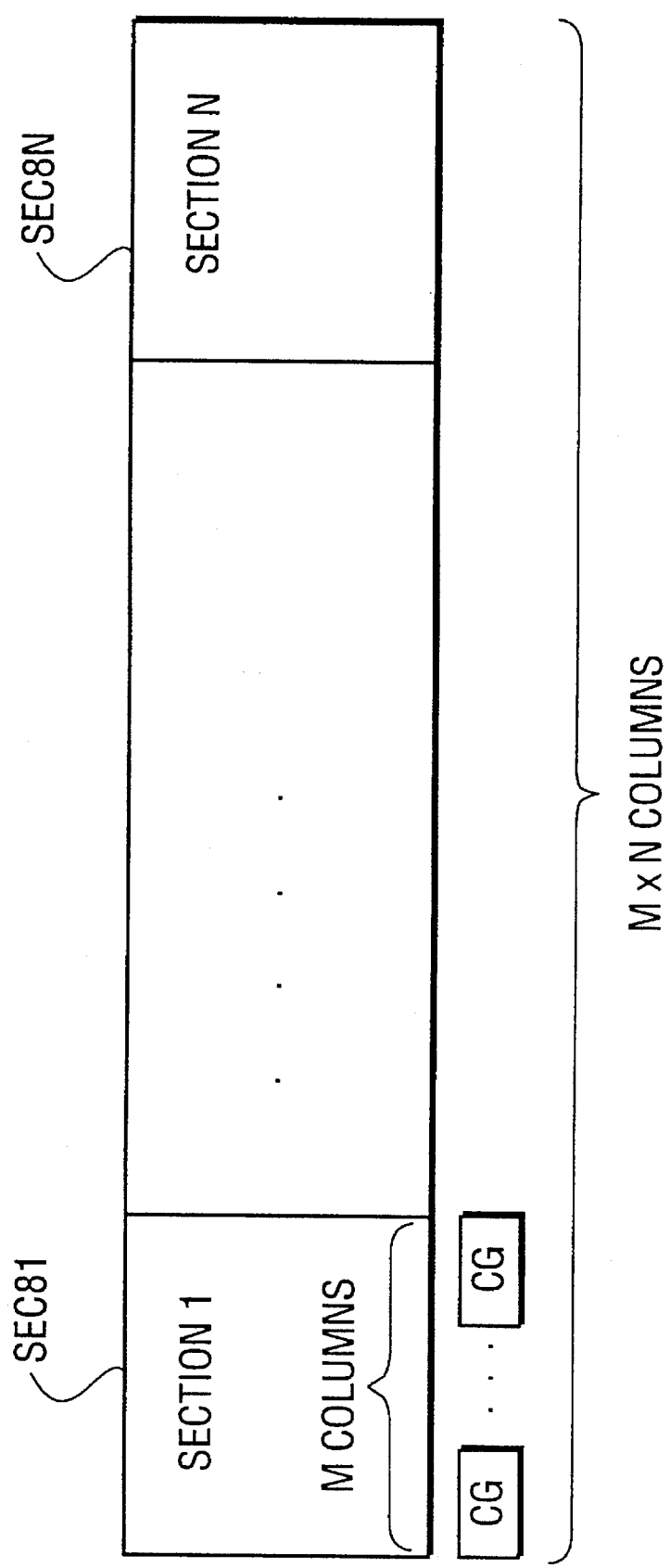
FIG. 8 is an explanatory view showing the configuration in a column direction of a semiconductor memory device according to a seventh or eighth embodiment of this invention.

As shown in FIG. 8, when it is assumed that the entire circuit is divided into N sections SEC81–SEC8N with respect to the column direction and M columns are provided in respective sections SEC, (M×N) columns exist as a whole.

Figure 9:
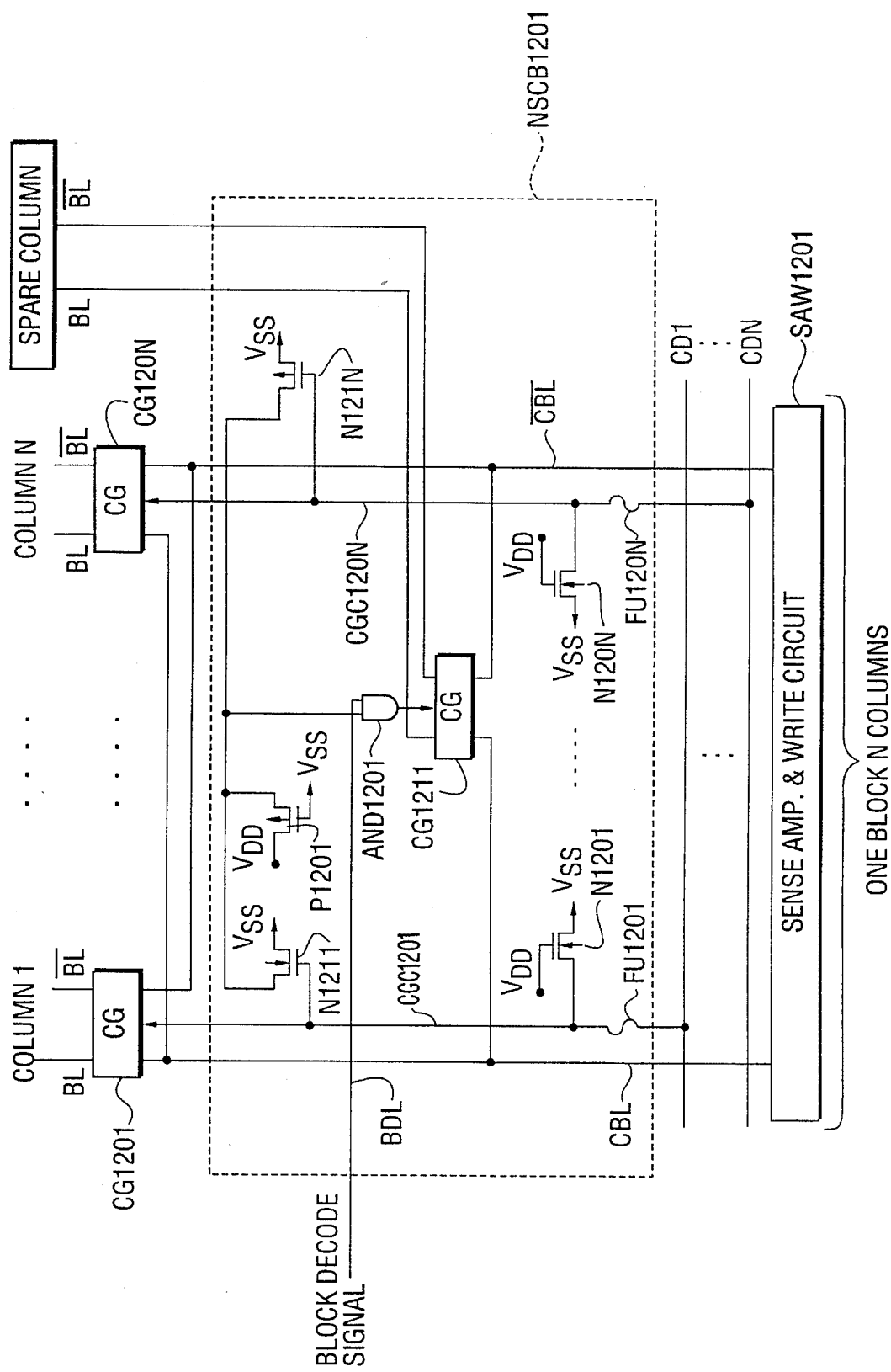
FIG. 9 is a circuit diagram showing the configuration of a semiconductor memory device according to the seventh embodiment of this invention.

The configuration in a column direction of a semiconductor memory device according to a seventh embodiment of this invention is shown in FIG. 9. A memory cell array (not shown) is divided into a plurality of blocks in a column direction, and the configuration within one block is shown in FIG. 9. In the seventh embodiment, only one I/O is included within one block.

The end portions of the bit line pairs BL, $\overline{BL}$ of N columns connecting memory cell array regions in a column direction are connected to N column gates CG1201–CG120N. The column gates CG1201–CG120N are connected to a sense amplifier and write circuit SAW1201 by common bit line pairs CBL, $\overline{CBL}$. At the common bit line pairs CBL, $\overline{CBL}$, a normal and spare control buffer NSCB1201 for controlling the operating states of the column gates CG1201–CG120N is provided.

The normal and spare column control buffer NSCB1201 is adapted so that a column decode signal is inputted from a corresponding column decode line CD of column decode lines CD1–CDN provided in correspondence with N columns, and a block decode signal for selecting any block is inputted, whereby this buffer operates in response to these decode signals. Control signals outputted from the normal and spare control buffer NSCB1201 are given to column gates CG1201 and CG120N to control their ON/OFF states.

In the normal and spare column control buffers NSCB1201, at column gate control lines CGC1201 and CGC120N connecting the column decode line CD1 and the column gates CG1201 and CG120N, defective column isolation fuses FU1201 and FU120N are respectively provided. In addition, normally ON N-channel transistors N1201 and N120N are respectively connected between these column gate control lines CGC1201 and CGC120N.

A block decode line BDL is connected to one input terminal of an AND circuit AND1201. To the other input terminal of the AND circuit AND1201, drains of an N number of N-channel transistors from N-channel transistor N1211 having a gate connected to the column gate control line CGC1201 and a source grounded up to N-channel transistor N121N having a gate connected to the column gate control line CGC120N and a source grounded, and drain of normally ON P-channel transistor P1201 are connected. The output terminal of the AND circuit AND1201 is connected to the control terminal of a column gate CG1211. In,it terminals of the column gate CG1211 are respectively connected to the common bit line pair CBL, $\overline{CBL}$, and output terminals of the column gate CG1211 are respectively connected to bit line pair $\overline{BL}$, BL of the spare column.

The device according to this invention thus constructed operates as follows. In the case where there is no defect on all of N normal columns 1–N, or in the case where even if any defect exists, any other column is selected, any one of columns gate CG is selected by column decode signals CD1–CDN, and is caused to be conductive.

Figure 10B:
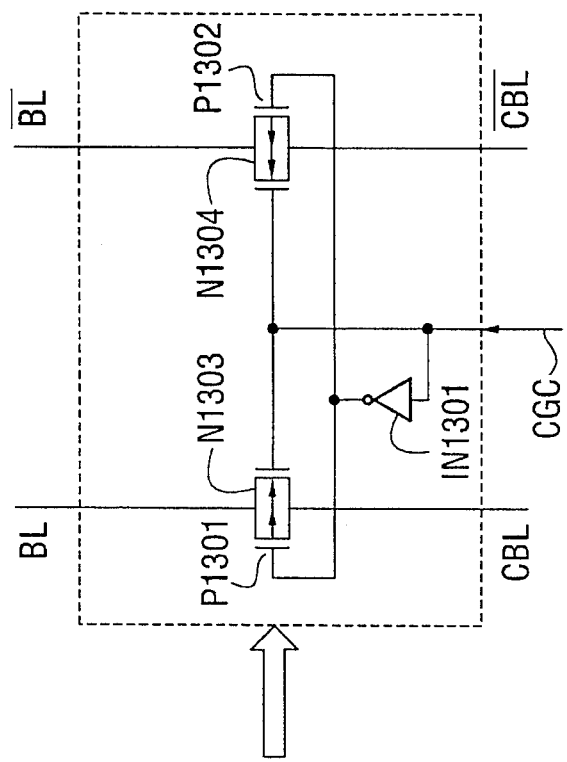
FIG. 10(a) is a circuit diagram showing one configuration of a column gate of the semiconductor memory device according to the seventh or eighth embodiment of this invention and FIG. 10(b) is a circuit diagram showing another configuration of the column gate.
Figure 10A:
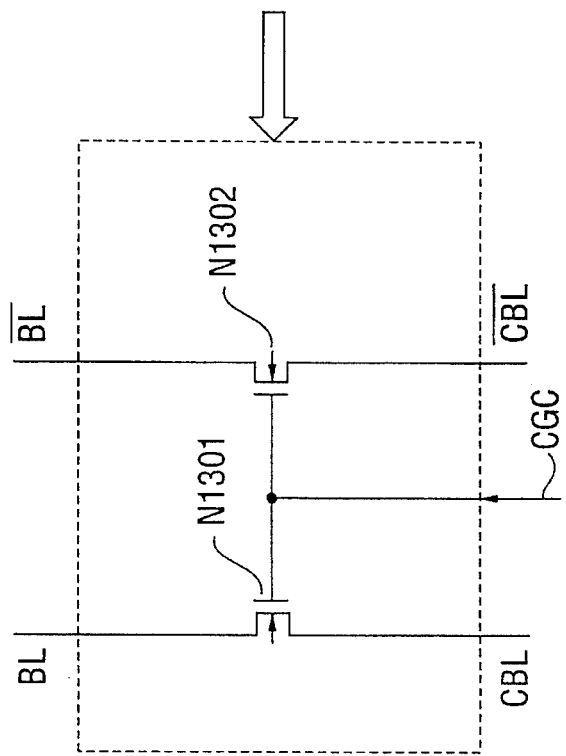

The column gate CG may be constructed respectively as shown in FIG. 10(a) and 10(b), for example. The column gate CG of FIG. 10(a) is comprised of N-channel transistors. Between common bit line pairs CBL, $\overline{CBL}$ and bit line pair BL, $\overline{BL}$, N-channel transistors N1301 and N1302 are respectively connected. The gates of these transistors are connected commonly to column gate control line CGC. When the column gate control line CGC is at high level, the transistors N1301 and N1302 become conductive, so the common bit line pair CBL, $\overline{CBL}$ and the bit line pair BL, $\overline{BL}$ are respectively brought into the connective state.

On the other hand, at the column gate CG shown in FIG. 10(b), between common bit lines CBL, $\overline{CBL}$ and bit line pair BL, $\overline{BL}$, N-channel transistor N1303 and P-channel transistor P1301, and N channel transistor N1304 and P channel transistor P1302 are respectively connected in parallel. The gates of the N-channel transistors N1303 and N1304 are connected commonly to column gate control line CGC, and the gates of the P-channel transistors P1301 and P1302 are connected commonly to the output terminal of inverter IN1301. The input terminal of the inverter IN1301 is connected to the column gate control line CGC. Also with respect to the column gate CG shown in FIG. 10(b), similarly to the column gate CG of FIG. 10(a), when the column gate control line CGC is caused to be at high level, transistors N1303, N1304, P1301 and P1302 become conductive, so common bit line pair CBL, $\overline{CBL}$ and bit line pair BL, $\overline{BL}$ are respectively connected.

In the case where, for example, the normal column 1 is defective, and the defective column isolation fuse FU1201 is blown off, that defective column is replaced by a spare column as follows. When the fuse FU1201 is blown off, a potential on the column gate control line CGC1201 of the column 1 is always at low level, so the column gate CG1201 maintains a closed state. When potential on the column gate control line CGC1201 shifts to low level in this way, since the N-channel transistor N1211 is in OFF state and the P-channel transistor P1201 is in ON state, the level of one input signal to the AND circuit AND1201 shifts to high level. Under such condition, when this block is selected, since the block decode signal is at high level, this signal of high level is delivered to the other input terminal of the AND circuit AND1201. As a result, an output of high level is delivered from the AND circuit AND1201 to the column gate CG1211. Thus, the column gate CG1211 is opened, so common bit lines CBL, $\overline{CBL}$ and bit line pair BL, $\overline{BL}$ of the spare column are respectively connected. Thus, the defect is releaved.

Figure 11:
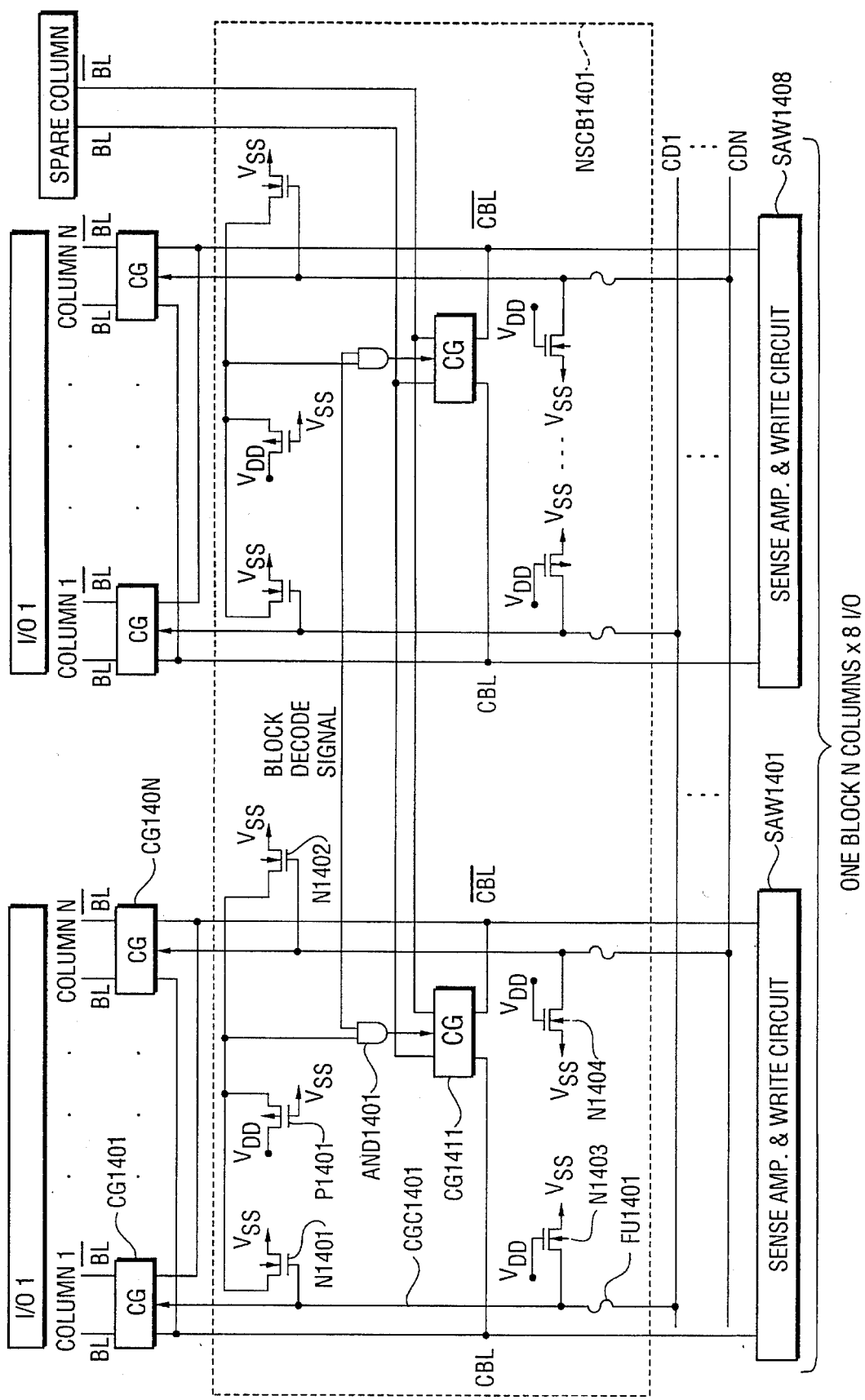
FIG. 11 is a circuit diagram showing the configuration of the semiconductor memory device according to the eighth embodiment of this invention.

The configuration of one block in a column direction of a semiconductor memory device according to an eighth embodiment of this invention is shown in FIG. 11. In this embodiment, within one block, there are provided eight I/O (I/O1–I/O8) having N normal columns, and there is further provided one spare column. Further, eight sense amplifiers and write circuits SAW1401–1408 are provided in correspondence with eight I/O. One normal and spare column control buffer NSCB1401 is provided per each block. This buffer has a configuration similar to the normal and spare column control buffer NSCB1201 shown in FIG. 9 every I/O.

In the case where normal columns are respectively selected in all I/O1–I/O8, any ones of N columns are selected every respective I/O. As a result, corresponding column gates CG are opened. Thus, common bit line pairs CBL, $\overline{CBL}$ and bit line pairs BL, $\overline{BL}$ are respectively connected.

When a defective column is selected in any one of the I/O1–I/O8, the operation is carried out as follows. When it is assumed that, e.g., the column 1 in the I/O1 is defective and the fuse FU1401 is blown off, the column gate CG1401 of the defective column 1 maintains a closed state irrespective of the level of the column decode line CD1. When the column gate control line CGC1401 of the column 1 is held at low level, since the N-channel transistor N1401 is in OFF state and the P-channel transistor P1401 is in ON state, a signal of high level is inputted to one input terminal of the AND circuit AND1401. Under such condition, when this block is selected, a block decode signal of high level is delivered to the other input terminal of the AND circuit AND1401. As a result, an output of high level is delivered to the column gate CG1411, so this gate is caused to be conductive. Thus, common bit line pair CBL, $\overline{CBL}$ and bit line pair BL, $\overline{B}$ of the spare columns are caused to be respectively conductive. Thus, the defect is relieved.

In accordance with the above-described embodiments, the following advantages can be provided.

Also in the case where the device is caused to have a redundancy circuit either in a row direction or in a column direction, both the spare row decoder and the spare column decoder are unnecessary. Accordingly, this can contribute to reduction of the chip area. As described above, by taking an example of 1M bit SRAM having 1024 rows by 1024 columns of the 8 bit configuration, the area of the spare row decoder per each spare row becomes equal to about 20000 $\mu m^2$. Thus, in the case where eight spare rows are provided, the area of about 160000 $\mu m^2$ is required as a whole. However, in accordance with the first to sixth embodiments, such reduction of the area can be made.

Further, the number of fuse blowing operations can be reduced. Also in the case where the device is caused to have redundancy in a row or column direction, there is no necessity of blowing a fuse for the purpose of storing a defective address. Namely, it is sufficient to blow only the defective row or column isolation fuse. Thus, the manufacturing cost can be reduced.

As described above by using the Table 1, in the case where the device is 1M bit SRAM of eight spare rows, ninety six (96) fuse blowing operations were required in the prior art. On the contrary, in accordance with the above-mentioned first to sixth embodiments, it is sufficient to carry out eight (8) times of blowing operations even at the maximum.

In a column direction, as shown in the Table 2, in the case where the device is 1M bit SRAM having eight spare rows, sixty four (64) blowing operations had to be conducted at the maximum in the prior art. On the contrary, in accordance with the seventh or eighth embodiment, it is sufficient to carry out eight (8) blowing operation at the maximum.

From a viewpoint of design of the circuit, in accordance with the first to eighth embodiments, the advantage that it is simple to increase or decrease the number of necessary memory cell arrays can be provided.

In accordance with the first to sixth embodiments, one block is constituted, e.g., by 128 normal rows and one spare row. On the other hand, in accordance with the seventh or eighth embodiment, one block is constituted by 128 normal columns and one spare row. By increasing or decreasing the number of memory cell arrays with such a block being as a unit, the scale of a memory cell array required as a whole can be readily changed. Thus, the development term for on chip memory in the standard cell, etc. can be reduced.

It is to be noted that the above-described embodiments are all presented only for the purpose of illustration, and these should not be considered to limit this invention. For example, the number of plural normal rows or normal columns provided in one block may take an arbitrary value equal to 2 or more. In addition, in the case where any one of normal rows or normal columns is defective, while corresponding normal row or normal column is caused to be in non-selective state by using isolation fuse, other means for electrically cutting off the conductive state between defective normal row selection line or normal column selection line and selection means may be instead used.

What is claimed is:

1. A semiconductor memory device comprising:

a plurality of blocks in which memory cells are respectively arranged on a plurality of normal rows and one spare row;

a plurality of normal row selection lines respectively provided for selecting any one of said normal rows, within said respective blocks;

one spare row selection line respectively provided for instead selecting said spare row in the case where any one of said normal rows is defective, within said respective blocks;

non-selection means provided for every said normal row selection line, and being such that when a corresponding normal row is defective, said non-selection means allows that defective normal row selection line to be brought into non-selective state; and selector means adapted so that when said normal rows within a corresponding block are all in nonselective state within said respective blocks, said selector means allows said spare row selection line to be brought into selective state.

2. The semiconductor memory device as set forth in claim 1, wherein said non-selection means has fuses provided at said respective normal row selection lines, whereby when any one of said normal rows is defective, the fuse provided on the corresponding normal row is blown off, and when the defective normal row is selected, said non-selection means allows all the normal rows to be in non-selective state, and wherein when all fuses that said non-selection means has are not blown off, said selector means allows the spare row selection line to be brought into nonselective state, and when any one of said fuses is blown off and the normal row corresponding to said blown fuse is selected, said selector means allows the spare row selection line to be brought into selective state.

3. A semiconductor memory device comprising:

a plurality of blocks in which memory cells are respectively arranged on a plurality of normal columns and one spare column, a plurality of normal column selection lines respectively provided for selecting any one of said normal columns, within said respective blocks;

one spare column selection line respectively provided for selecting instead said spare column in the case where any one of said normal columns is defective, within said respective blocks;

non-selection means provided every said normal column selection lines, and adapted so that when a corresponding normal column is defective, said non-selection means allows that normal column selection line to be brought into non-selective state, and selector means adapted so that when said normal columns within a corresponding block are all in non-selective state within said respective blocks, said selector means allow said spare column selection line to be brought into selective state.

4. The semiconductor memory device as set forth in claim 3, wherein said non-selection means has fuses provided at said respective normal column selection lines, whereby when any one of said normal columns is defective, the fuse provided on the corresponding normal column is blown off, and when the defective normal column is selected, said non-selection means allows all the normal columns to be brought into non-selective state, and wherein when all fuses that said non-selection means has are not blown, said selector means allows said spare column selection line to be brought into nonselective state, and when any one of said fuses is blown off and the normal column corresponding to said blown fuse is selected, said selector means allows said spare column selection line to be brought into selective state.

5. A semiconductor memory device, comprising:

a plurality of normal row selection lines having memory cells respectively arranged thereon;

a spare row selection line having spare memory cells arranged thereon;

a plurality of row selection units for selecting one of the normal row selection lines and outputting a second potential to the selected one of the normal row selection lines;

a plurality of fuses connected respectively between the normal row selection lines and outputs of the row selection units;

a plurality of first circuits provided respectively at the normal row selection lines which set the respective normal selection lines at a first potential except in the case that the corresponding normal selection line is selected and the corresponding fuse is not blown off;

a plurality of detecting circuits provided respectively at the normal row selection lines for detecting the respective levels of the normal selection lines; and a judging circuit connected to outputs of the detecting circuits which selects the spare row selection line when all the detecting circuits detect the levels of the respective normal row selection lines to be at the first potential.

6. The semiconductor memory device as set forth in claim 5, further comprising a plurality of buffer circuits connected respectively between one end of the respective fuses and the respective normal row selection lines.

7. A semiconductor memory device, comprising:

a plurality of normal column selection lines in which memory cells are respectively arranged thereon;

a spare column selection line in which spare memory cells are arranged thereon;

a plurality of column selection units for selecting one of the normal column selection lines and outputting a second potential to the selected one of the normal column selection lines;

a plurality of fuses connected respectively between the normal column selection lines and outputs of the column selection units;

a plurality of first circuits provided respectively at the normal column selection lines which set the respective normal column selection lines at a first potential except when the corresponding normal column selection line is selected and the corresponding fuse is not blown off;

a plurality of detecting circuits provided respectively at the normal column selection lines for detecting the respective levels of the normal column selection lines; and a judging circuit connected to outputs of the detecting circuits which selects the spare column selection line when all the detecting circuits detect that the levels of the respective normal column lines are at the first potential.

8. The semiconductor memory device as set forth in claim 7, further comprising a plurality of buffer circuits connected respectively between one end of the respective fuses and the respective normal column selection lines.

* * * * *